(12) United States Patent
Koshiishi et al.

(10) Patent No.: US 8,080,126 B2
(45) Date of Patent: Dec. 20, 2011

(54) PLASMA PROCESSING APPARATUS

(75) Inventors: Akira Koshiishi, Kofu (JP); Keizo Hirose, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 166 days.

(21) Appl. No.: 12/195,842

(22) Filed: Aug. 21, 2008

(65) Prior Publication Data

US 2008/0308041 A1 Dec. 18, 2008

Related U.S. Application Data

(62) Division of application No. 09/959,745, filed as application No. PCT/JP00/02770 on Apr. 27, 2000, now Pat. No. 7,537,672.

(30) Foreign Application Priority Data

| May 6, 1999 | (JP) | 11-125637 |
| May 7, 1999 | (JP) | 11-126878 |
| May 11, 1999 | (JP) | 11-129696 |
| May 21, 1999 | (JP) | 11-141209 |

(51) Int. Cl.
*H01L 21/00* (2006.01)

(52) U.S. Cl. .................................. 156/345.47

(58) Field of Classification Search ............ 156/345.43, 156/345.44, 345.45, 345.46, 345.47; 118/723 E
See application file for complete search history.

(56) References Cited

U.S. PATENT DOCUMENTS

| 4,148,705 A | 4/1979 | Battey et al. |
| 4,559,125 A | 12/1985 | Mularie |
| 4,812,712 A | 3/1989 | Ohnishi et al. |
| 4,874,494 A | 10/1989 | Ohmi |
| 4,950,956 A | 8/1990 | Asamaki et al. |
| 5,074,456 A | 12/1991 | Degner et al. |
| 5,110,438 A | 5/1992 | Ohmi et al. |
| 5,210,466 A | 5/1993 | Collins et al. |
| 5,272,417 A | 12/1993 | Ohmi |
| 5,478,429 A | 12/1995 | Komino et al. |
| 5,534,751 A | 7/1996 | Lenz et al. |
| 5,653,812 A | 8/1997 | Petrmichl et al. |
| 5,685,949 A | 11/1997 | Yashima |
| 5,728,261 A | 3/1998 | Wolfe et al. |
| 5,728,278 A | 3/1998 | Okamura et al. |
| 5,779,803 A | 7/1998 | Kurono et al. |
| 5,846,885 A | 12/1998 | Kamata et al. |

(Continued)

FOREIGN PATENT DOCUMENTS

DE 33 36 652 A1 4/1985

(Continued)

*Primary Examiner* — Ram Kackar
*Assistant Examiner* — Anna Crowell
(74) *Attorney, Agent, or Firm* — Oblon, Spivak, McClelland, Maier & Neustadt, L.L.P.

(57) ABSTRACT

In the plasma processing apparatus of the present invention, a first electrode for connecting a high frequency electric power source in a chamber is arranged to be opposed to a second electrode. A substrate (W) to be processed is placed between the electrodes. There is provided a harmonic absorbing member for being able to absorb harmonics of the high frequency electric power source so as to come in contact with a peripheral portion or circumference of a face of the first electrode 21, which is opposite the second electrode. The harmonic absorbing member absorbs the reflected harmonic before the harmonic returns to the high frequency electric power source. By absorbing the harmonic in this manner, the standing wave due to the harmonic will be effectively prevented from being generated, and the density of plasma is made even.

4 Claims, 12 Drawing Sheets

U.S. PATENT DOCUMENTS

| | | | |
|---|---|---|---|
| 5,863,339 A | 1/1999 | Usami | |
| 5,900,103 A | 5/1999 | Tomoyasu et al. | |
| 5,904,778 A | 5/1999 | Lu et al. | |
| 5,993,597 A * | 11/1999 | Saito et al. | 156/345.47 |
| 6,110,287 A | 8/2000 | Arai et al. | |
| 6,228,438 B1 | 5/2001 | Schmitt | |
| 6,245,190 B1 | 6/2001 | Masuda et al. | |
| 6,357,385 B1 | 3/2002 | Ohmi et al. | |
| 7,104,217 B2 | 9/2006 | Himori et al. | |
| 2004/0261714 A1 * | 12/2004 | Choi | 118/723 E |

FOREIGN PATENT DOCUMENTS

| | | |
|---|---|---|
| EP | 0 678 903 A1 | 10/1995 |
| EP | 0 779 644 A | 6/1997 |
| EP | 0809274 A1 | 11/1997 |
| JP | 06333878 A * | 12/1994 |
| JP | 7-106097 | 4/1995 |
| JP | 7-302786 | 11/1995 |
| JP | 8-227875 | 9/1996 |
| JP | 9-167698 | 6/1997 |
| JP | 9-234358 | 9/1997 |
| JP | 9-279350 | 10/1997 |
| JP | 09279350 A * | 10/1997 |
| JP | 10-172792 | 6/1998 |
| JP | 11-61452 | 3/1999 |
| JP | 11-111494 | 4/1999 |
| JP | 2000-64051 | 2/2000 |
| KR | 1997-0067659 | 10/1997 |
| WO | WO 97/03224 | 1/1997 |

\* cited by examiner

PLASMA PROCESSING APPARATUS

CROSS-REFERENCE TO RELATED APPLICATIONS

This application is a divisional of and claims the benefit of U.S. application Ser. No. 09/959,745, filed Nov. 5, 2001, now U.S. Pat. No. 7,537,672 which is a National Stage application of PCT/JP00/02770, filed Apr. 27, 2000, and claims priority to Japanese Patent Application Nos. 11-125637, filed May 6, 1999; 11-126878, filed May 7, 1999; 11-129696, filed May 11, 1999 and 11-141209, filed May 21, 1999. The entire content of each of these applications is incorporated herein by reference to the extent that such incorporation does not create an issue of new matter.

TECHNICAL FIELD

The present invention relates to a plasma processing apparatus for performing etching and film forming on a substrate such as a semiconductor substrate by plasma processing.

BACKGROUND ART

In a process for manufacturing semiconductor devices, various plasma processing such as etching, film forming by sputtering or CVD film forming (Chemical Vapor Depositing) have been frequently employed.

There have been known various types of plasma processing apparatuses, among which a capacitive coupling type parallel plate plasma processing apparatus is the apparatus the most popularly distributed and used.

This type of plasma processing apparatus has a pair of parallel flat plate electrodes (upper and lower electrodes) in a reduced-pressure chamber. A semiconductor wafer to be processed is placed between the electrodes, then process gas (treatment gas) is introduced into the chamber and electric power with high frequency is applied to one of the electrodes. A high frequency electric field generated between the electrodes generates plasma from the process gas to perform plasma processing on the semiconductor wafer.

In etching an oxide film or the like formed on a semiconductor wafer with use of such a plasma processing apparatus, the pressure in the chamber is set at an intermediate level to generate plasma having an intermediate density, thereby the optimum radical control can be attained. In such a condition, the optimum plasma can be obtained to realize etching with good stability and reproducibility at a high selective ratio.

In accordance with the downsizing of a device, however, the request for the ultra-integration of a circuit is increased. There are also design rule constraints on features like the contact hole. The contact hole is required to be thin and deep, i.e., to have higher aspect ratio. The conventional oxide film etching method is, therefore, beginning to be not good enough to satisfy the demands of the market.

To cope with such recent requests, the frequency of the electric power applied to the electrode is set at a higher level to generate plasma having a higher density, so as to maintain good dissociation. By generating the plasma in such a manner, suitable plasma can be generated in a lower pressure, and thus the device with a smaller design rule can be manufactured.

With the conventional plasma processing apparatus, however, the upper electrode is formed from a conductor or semiconductor. Therefore, when the frequency of the electric power applied to the upper electrode is set at a high level, the inductance on the surface of the electrode will be increased so as not to be neglected, whereby the electric field in the opposite direction will be uneven.

Further, such a higher density of the plasma by the higher frequency remarkably causes non-linear characteristics of the plasma, so that a harmonic may be easily interposed on the reflected wave form the plasma. Particularly, with use of the electrode having a diameter of 250 to 300 mm, it has been found from experience that such a harmonic generates a standing wave on the surface of the electrode, which makes the electric field on the surface of the electrode uneven.

If the electric field is made uneven in such a manner, the density of plasma will be also made uneven, with the result that the etching rate of etching will be uneven. Accordingly, it is essential to make the etching rate even by eliminating the causes of the uneven electric field.

The above-mentioned problems in generating a high-density plasma, however, have not been recognized clearly, and thus a proposal for preventing the above-mentioned uneven electric field has not sufficiently been presented yet.

Further, according to the conventional plasma processing apparatus, the electric power is applied to the upper electrode with use of an electric power applying rod, and thus a box having a size substantially equal to a chamber encloses the electric power applying rod to shield electromagnetic wave.

However, since the inductance of the electric power applying rod is very high, if the frequency of the high frequency power supplied to the upper electrode is set at a higher level in order to increase the plasma density, the harmonic of the wave reflected from the plasma is reflected due to the inductance component of the electric power applying rod. Further, reflection is caused at every portions within the box in which the electric power applying is disposed, and the resultant reflected harmonic backs to the surface of the upper electrode exposed to the plasma.

With the electrode having a diameter of 250 mm to 300 mm, a standing wave will be easily generated on the surface of the electrode due to the higher harmonic (higher harmonic), which makes the electric field on the surface of the electrode uneven.

The electric power applying rod is provided to the center of the upper electrode on the rear surface thereof. When the frequency of the electric power applied to the electrode is increased to generate high-density plasma, the high frequency current flows only on the surface of the electrode. The high frequency electric power applied from the electric power applying rod to the upper electrode flows through the rear surface of the electrode to the outer periphery of the round electrode to be supplied from the outer periphery to the center of the electrode.

The outer periphery of the electrode is enclosed by an insulator (capacity component) and the chamber enclosing the insulator is grounded. With this structure, the standing wave is generated on the plasma contacting face of the upper electrode by the interference, which makes the electric field on the electrode in the direction of the diameter uneven. The unevenness of the electric field also makes the density of the plasma uneven, which causes an uneven etching rate. Accordingly, these causes need to be eliminated to make the etching rate even.

However, as mentioned before, the problems in generating the high-density plasma, have not been recognized clearly, and thus a proposal for preventing the above-mentioned uneven electric field has not been sufficiently presented yet.

DISCLOSURE OF INVENTION

The present invention is intended to provide a plasma processing apparatus capable of making the density of plasma even by suppressing the unevenness of the electric field on the surface of an electrode in the plasma processing using high-density plasma with use of which a device can be formed finer.

In order to attain the above-mentioned object, the present invention provides a plasma processing apparatus comprising a chamber containing a substrate to be processed; a first electrode and a second electrode arranged to be opposed to each other in the chamber; high frequency electric power applying means for applying high frequency electric power to the first electrode; a harmonic absorbing member arranged to come into contact with one of an outer periphery and an outer peripheral face on an opposing face (on which the first electrode faces the second electrode) of the first electrode being opposed to the second electrode, for absorbing a harmonic generated by the high frequency electric power applied by the high frequency electric power applying means; exhaust means for exhausting the chamber to maintain a pressure in the chamber at a reduced level; and process gas introducing means for introducing process gas into the chamber, wherein in a state that one of the first and second electrodes is caused to hold the substrate to be processed, while the harmonic absorbing member absorbs the harmonic generated by the high frequency electric power, a high frequency electric field is formed between the first and the second electrodes to generate plasma of the process gas, and the substrate to be processed is subjected to plasma processing with the plasma while the harmonic absorbing member absorbs the harmonic generated by the high frequency electric power.

In the plasma processing apparatus of the present invention, high frequency electric power is applied to the first electrode. There is provided a harmonic absorbing member for absorbing a harmonic of the high frequency electric power source so as to come into contact with a peripheral portion or circumference of a face of the first electrode, which is opposite to the second electrode. The harmonic absorbing member absorbs a harmonic reflected from plasma before the harmonic returns to the high frequency electric power source. By absorbing the harmonic in this manner, the standing wave due to the harmonic will be effectively prevented from being generated, and the density of plasma is made even. With such a structure, the standing wave due to the harmonic can be prevented to suppress the unevenness of the electric field on the surface of the electrode due to the standing wave, with the result that the density of plasma can be made even.

BEST MODE FOR CARRYING OUT OF THE INVENTION

The present invention can be more fully understood from the following detailed description of embodiments of the invention in conjunction with the accompanying drawings.

Figure 1:
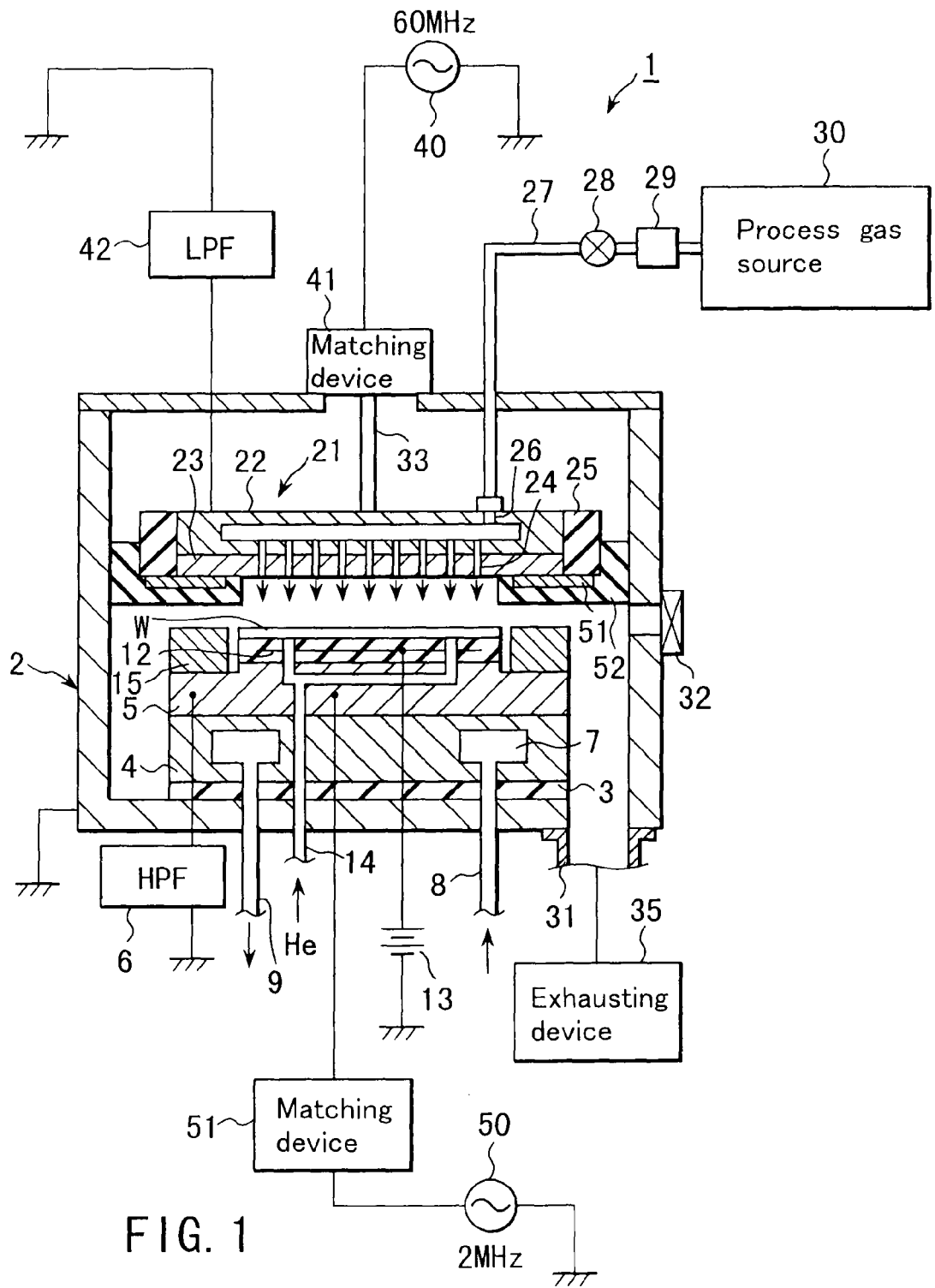
FIG. 1 is a sectional view showing the plasma etching apparatus according to the first embodiment of the present invention.

FIG. 1 is a sectional view schematically showing the plasma etching apparatus according to the first embodiment of the present invention.

A plasma processing apparatus 1 is constituted as a capacitive coupling type parallel plate etching apparatus having two electrode plates being opposed to each other (arranged in parallel and facing each other) one of which is connected to a plasma generating electric power source.

The plasma processing apparatus 1 has a chamber 2 formed of aluminum in a cylinder shape the surface of which is processed (subjected to an anodic oxidation process) to form alumite. The chamber 2 is grounded.

The chamber 2 is provided on the bottom face with an insulator 3, such as a ceramic, upon which a susceptor supporting body 4 formed in a substantially columnar shape is placed, for mounting an object to be processed, such as a semiconductor wafer (hereinafter referred to as "wafer") W. There is further provided on the susceptor supporting body 4 a susceptor 5 constituting a lower electrode. The susceptor 5 is connected to a high-pass filter (HPF) 6.

The susceptor supporting body 4 contains a refrigerant passage 7 into which a refrigerant such as liquid nitrogen is introduced through a refrigerant pipe 8 and circulates therein. The coldness of the refrigerant is transmitted to the wafer W via the susceptor 5 to control the surface of the wafer W which is to be processed at a desired temperature.

The susceptor 5 is formed in a disk-like shape the center of the upper side of which protrudes upwards, and mounts the wafer W and an electrostatic chuck 11. The electrostatic chuck 11 has an electrode 12 implanted in the body formed of an insulator, and electrostatically holds the wafer W with use of the Coulomb force or the like when the electrode 12 is applied with a direct voltage of 1.5 kV, for example, by a direct voltage source 13.

The insulating plate 3, the susceptor supporting body 4, the susceptor 5, and the electrostatic chuck 11 is provided with a gas path 14 for supplying a temperature transmission medium such as He gas to the rear surface of the wafer W, via which the coldness of the susceptor 5 is transmitted to the wafer W to control the wafer W at a predetermined temperature. The susceptor 5 is provided on the outer periphery of the upper surface with a circular focus ring 15 to surround the wafer W mounted on the electrostatic chuck 11. The focus ring 15 is formed of a conductive material such as silicon and facilitates even etching of the wafer.

The susceptor 5 functions as the lower electrode. There is provided an upper electrode 21 above and opposite the susceptor 5.

The faces of the susceptor 5 and the upper electrode 21 which face each other are referred to as "opposing faces" hereinafter. The faces not being opposed to each other are referred to as non-opposing faces.

The opposing face of the upper electrode 21 is formed as an electrode plate 23 having a number of delivery holes 24. The electrode plate 23 is fixed to an electrode supporting body 22. The body 22 is a water-cooled structure formed from a conductive material such as aluminum the surface of which has been processed to form alumite. The upper electrode 21 according the embodiments to be described below is comprised by the electrode plate 23 and the electrode supporting body 22.

The outer periphery of the upper electrode 21 is provided with insulating member 25 formed in a ring-like shape to be placed therein.

There is provided a harmonic absorbing member 51 formed in a ring-shape so as to come in contact with the outer peripheries of the electrode plate 23 and the insulating member 25. There is also provided an insulating member 52 formed in a ring-shape so as to bridge the electrode plate 23 and the insulating member 25 and cover the harmonic absorbing member 51.

With this structure, the upper electrode 21 is fixed to on the chamber 2 to be put into the insulating material 52. The susceptor 5 is separated from the upper electrode 21 by around 10 to 60 mm.

The harmonic absorbing member 51 is designed to absorb or attenuate the harmonic generated by the high frequency electric power reflected by plasma by using the magnetic resonance loss effect. As a material absorbing the harmonic, ferrite is well-known, and thus the harmonic absorbing member 51 is formed of a material containing ferrite. By varying the thickness and the material of the harmonic absorbing member 51, the frequency band of the harmonic to be absorbed can be adjusted.

On the other hand, the frequency band of the harmonic to be absorbed can be widened by forming the harmonic absorbing member 51 of laminated materials having different frequency characteristics. In this manner, a standing wave can be prevented by absorbing and attenuating the harmonic having the desired frequency.

The electrode supporting body 22 of the upper electrode 21 is provided with a gas inlet 26 connected to a gas supplying pipe 27. The gas supplying pipe 27 is connected to a process gas source 30 via a valve 28 and a mass flow controller 29. The process gas source 30 supplies process gas for plasma processing such as etching.

The gas conventionally employed in the plasma processing can be employed as the process gas. It is preferable to employ gas containing elements of the halogen series, such as fluorocarbon gas ($C_xF_y$) or hydrofluorocarbon gas ($C_pH_qF_r$). The rare gas such as Ar, He, and the like and $N_2$ can be added, of course. The bottom portion of chamber 2 is provided with an exhaust pipe 31 connected to an exhaust system 35. The exhaust system 35 has a vacuum pump such as a turbo molecule pump which can reduce the pressure in the chamber 2 to a predetermined pressure such as 1 Pa or less.

The chamber 2 is provided with a gate valve 32 on a sidewall. When the gate valve 32 is opened, the wafer W is conveyed to/from a load lock chamber (not shown) adjacent to the chamber 2.

The upper electrode 21 is connected to a high frequency electric power source 40 for generating plasma via a matching device 41. The electric power from the high frequency electric power source 40 is supplied to the upper electrode 21 via an electric power supplying rod 33.

The upper electrode 21 is connected to a low pass filter (LPF) 42. The high frequency electric power source 40 supplies electric power having a frequency of 27 MHz or higher. By applying electric power having such a high frequency, a high density plasma can be generated so as to maintain the chamber 2 at a good dissociation condition to enable plasma processing under a low pressure.

In this example, an electric power source 40 supplies electric power having a frequency of 60 MHz. The susceptor 5 as the lower electrode is connected to a high frequency electric power source 50 via a matching device 51 on the supplying line.

The high frequency electric power source 50 supplies high frequency electric power having an arbitrary frequency within a range of 100 kHz to 10 MHz. By applying the electric power within such a frequency band, a suitable ion effect can be applied to the wafer W without any damage. In this embodiment, an electric power source for supplying electric power having a frequency of 2 MHz is used as the high frequency electric power source 50.

The process using the plasma etching apparatus 1 constituted as above will be described below.

After the gate valve 32 is opened, the wafer W is conveyed to the chamber 2 from the load lock chamber (not shown) to be mounted on the electrostatic chuck 11. The direct voltage source 13 then applies a direct voltage to electrostatically absorb the wafer W on the electrostatic chuck 11.

The gate valve 32 is then closed and the exhaust system 35 reduces the pressure in the chamber 2 to the desired level.

Subsequently, the valve 28 is opened to introduce the process gas into the upper electrode 21 from the process gas source 30 through the process gas supplying pipe 27 and the gas inlet 26 while the gas flow rate is controlled by the mass flow controller 29. The process gas passes through the delivery holes 24 of the electrode plate 23 and is delivered evenly to the wafer W as indicated by an arrow shown in FIG. 1 so as to maintain the pressure in the chamber 2 at a predetermined value.

The high frequency electric power source 40 applies electric power having a high frequency no lower than 27 MHz, for example, 60 MHz, to the upper electrode 21. By applying the high frequency wave in such a manner, a high frequency electric field is generated between the upper electrode 21 and the susceptor 5 as the lower electrode. The process gas is dissociated to be plasma in the electric field, and the plasma etches the wafer W.

On the other hand, the high frequency electric power source 50 applies electric power having high frequency within the range of 100 kHz to 10 MHz, for example, 2 MHz, to the susceptor 5. By applying the high frequency wave in such a manner, the ions in the plasma are introduced into the side of the susceptor 5, and anisotropic property of the etching is improved by the ion assistance.

By setting the frequency of the high frequency electric power applied to the upper electrode 21 at 27 MHz or higher, the density of plasma can be increased. However, merely by setting the frequency of the high frequency electric power applied to the upper electrode at the high level, the harmonic is reflected from the plasma. The reflected harmonic generates the standing wave under the electrode plate 23, which causes the unevenness of the electric field under the electrode plate 23.

Figure 2:
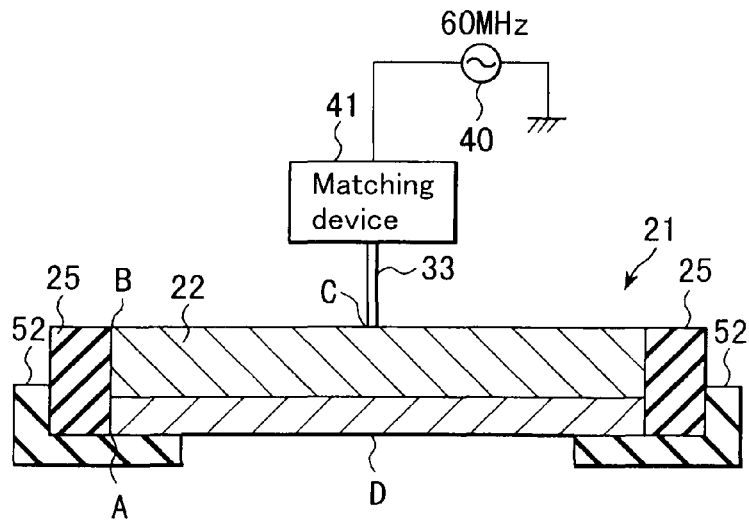
FIG. 2 is a schematic view for explaining the cause of the standing wave formed on the electrode applied with a high frequency wave.

More specifically, when the high frequency wave of 27 MHz or higher is employed to generate plasma, a harmonic n times higher than the frequency of the applied electric power will be easily generated by plasma. When the harmonic backs to the high frequency wave source from the upper electrode 21, the harmonic is reflected at the portions such as a border between the upper electrode 21 and the insulating member 25 as indicated as A and B and the electric power supplying position indicated as C in FIG. 2, and generates the standing wave between these portions and the center of the upper electrode 21 indicated as D.

When the wavelength of the standing wave equals to ¼ times of a wavelength λ of a harmonic, i.e., λ/4, the density of plasma is increased near the center of the upper electrode 21, which will cause uneven plasma. For example, when a high frequency wave having a frequency of 60 MHz is employed as the high frequency electric power source 40, the wavelength of the high frequency wave is 5 m. Assuming that the distance between the portions A to D is set at 0.14 m, the calculation indicates that the harmonic of the ninth degree will be easily generated.

In consideration of the wavelength shortening rate proportional to the ½th power of the dielectric constant of high frequency wave path material, the harmonic of the third to sixth degree will be easily generated. When the distance between the portions A to D is set at 0.07 m, however, the similar problem will occur even using the high frequency wave of 13.56 MHz.

In contrast, according to the present embodiment, the harmonic back to the high frequency electric power source 40 is absorbed by providing the harmonic absorbing member 51 to the electrode plate 23 on the side of the opposing face, thereby the generation of the standing wave can be prevented.

Figure 3:
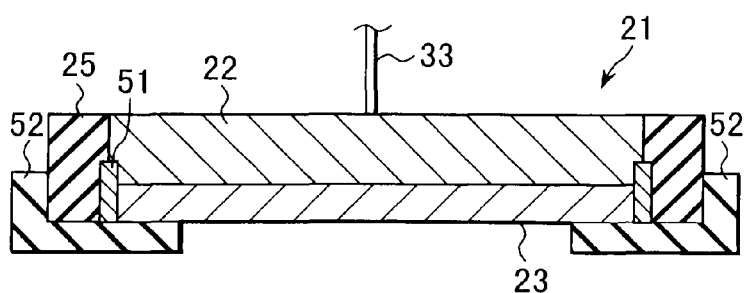
FIG. 3 is a sectional view showing an example of an arrangement of a high frequency wave absorbing member.

The harmonic absorbing member 51 is formed in a ring-like shape in the present embodiment to improve the harmonic absorbing effect. It goes without saying that the shape of the harmonic absorbing member 51 is not limited to a ring. The same effect can be also attained by providing the harmonic absorbing member 51 to the outer periphery of the upper electrode 21, as shown in FIG. 3.

When the harmonic absorbing member 51 is formed of ferrite sinter, the harmonic absorbing member 51 can absorb and attenuate harmonic using the magnetic resonance loss effect, as described above. In this case, the frequency band that can be attenuated will be shifted by the thickness of the harmonic absorbing member 51. When the thickness of the harmonic absorbing member 51 is halved, the frequency band that can be attenuated will be doubled.

Figure 4:
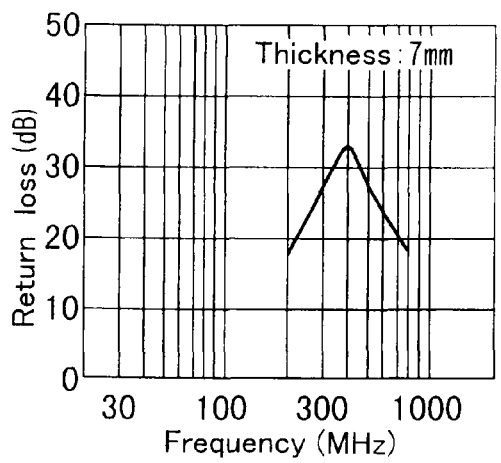
FIG. 4 is a graph showing frequency characteristics of return loss when a ferrite sinter having a thickness of 7 mm is used as the high frequency wave absorbing member.
Figure 5:
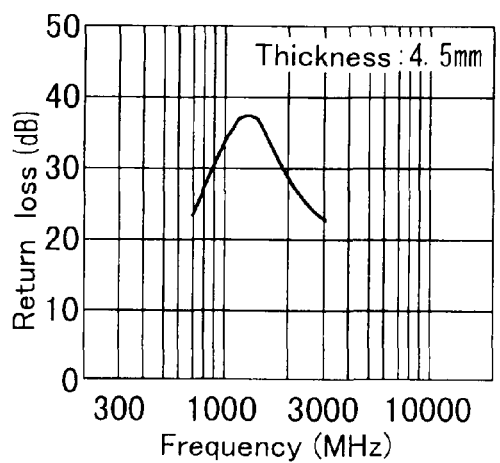
FIG. 5 is a graph showing frequency characteristics of return loss when a ferrite sinter having a thickness of 4.5 mm is used as the high frequency wave absorbing member.

More specifically, when the thickness of the harmonic absorbing member 51 is 7 mm, the harmonic of 200 to 800 MHz can be attenuated by 20 dB, as shown in FIG. 4. When the thickness of the harmonic absorbing member 51 is 4.5 mm, the harmonic of 700 MHz to 3 GHz can be attenuated by 20 dB, as shown in FIG. 5. The frequency band that can be attenuated can be widened by laminating ferrite layers having different frequency characteristics. For example, when the above-mentioned layers having a thickness of 7 mm and 4.5 mm are laminated, the harmonic having a wide frequency band from 200 MHz to 3 GHz can be attenuated.

The present embodiment will not be limited to the first embodiment and various modifications can be attained.

For example, the case where the upper electrode is applied with electric power having high frequency of 27 MHz is described in the first embodiment, but the frequency lower than 27 MHz is also effective.

Further, in the present embodiment, the upper and lower electrodes are applied with electric power having high frequency in the first embodiment, the type that only the upper electrode is applied with electric power having high frequency may be employed. The present embodiment can be applied to the apparatus wherein the lower electrode is applied with electric power having high frequency. In this case, the harmonic absorbing member is arranged to come into contact with the edge portion of the face of the lower electrode, which is opposed to the upper electrode, or the periphery of the lower electrode.

In addition, the case where the semiconductor wafer is used as the substrate to be processed and etched is described in this embodiment, but the substrate is not limited to the semiconductor wafer, but the other substrate such as a liquid display apparatus (LCD) or the like may be processed. The plasma processing is not limited to the etching, but an other processing such as sputtering, CVD, or the like may be performed.

According to the present embodiment, the first electrode is applied with electric power having high frequency, and the harmonic absorbing member for absorbing harmonic having frequency of the high frequency wave electric power applied by the high frequency wave electric power applying means is arranged to come in contact with the edge portion of the face of the first electrode, which is opposed to the second electrode, or the periphery of the first electrode. With this method, the harmonic reflected by plasma passes through the electrode and reaches the harmonic absorbing member before returning to the high frequency electric power source, where the harmonic will be absorbed.

Accordingly, the standing wave due to the harmonic will be prevented from being generated, and the unevenness of the electric field on the surface of the electrode, which is caused by the standing wave, can be suppressed to make the density of plasma even.

Figure 6:
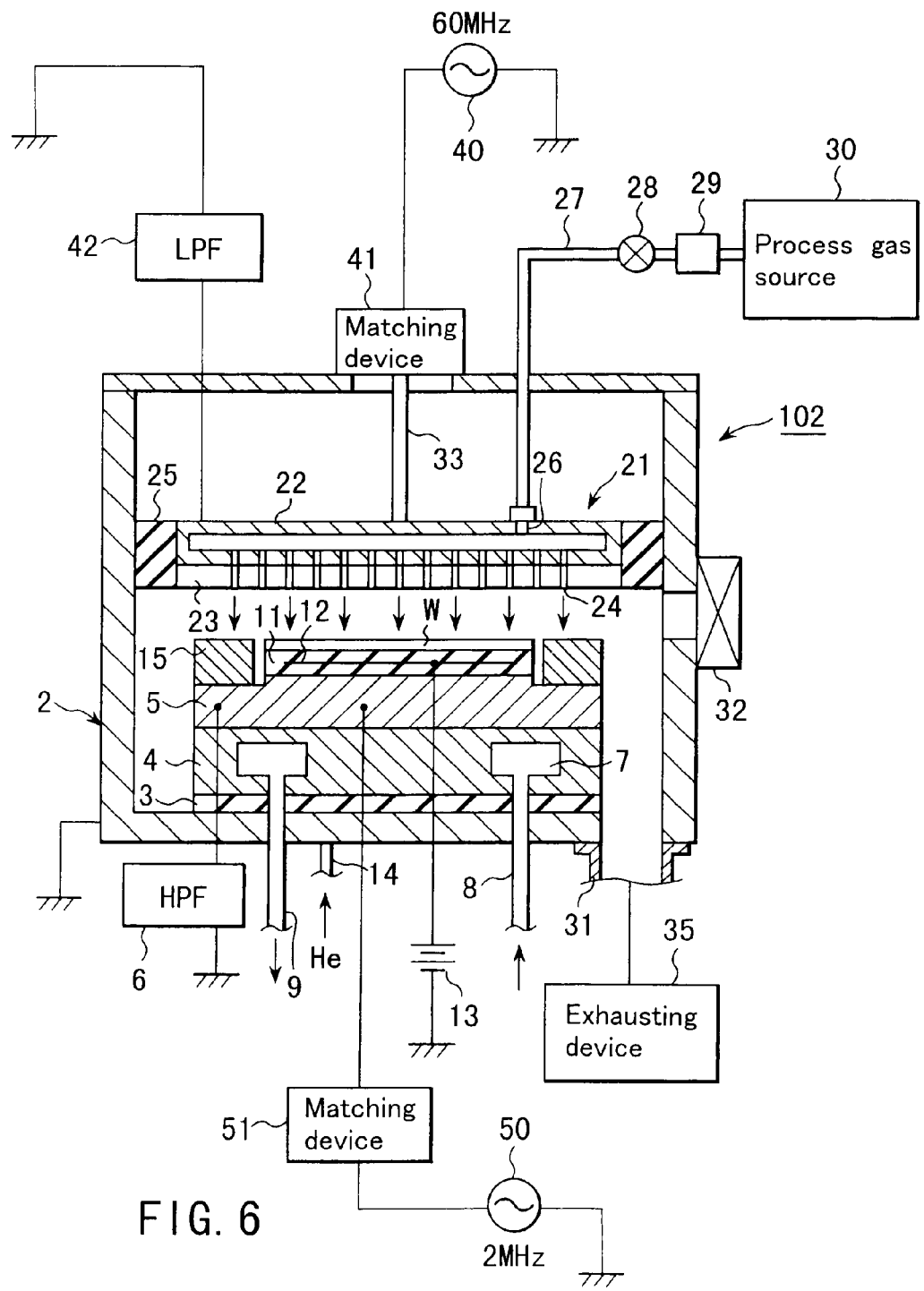
FIG. 6 is a sectional view showing the plasma etching apparatus according to the second embodiment of the present invention.

FIG. 6 shows an example of a constitution of a plasma processing apparatus according to the second embodiment of the present invention, used as a capacitive coupling type parallel plate etching apparatus. The constituent elements as the main feature of the apparatus according to the present embodiment will be described below, and the same constituent elements as those of the first embodiment shown in FIG. 1 will be denoted by the same symbols and the description thereof will be omitted.

The upper electrode 21 of this etching apparatus 102 is arranged on the upper portion in the chamber 2 to be opposed to a suscepter 5 via an insulating member 25 covering the electrode like a ring along the outer periphery thereof. The upper electrode 21 is constituted by the electrode plate 23 having numerous delivery holes 24 and the electrode supporting body 22 so as to be integrated.

The upper electrode of the present embodiment does not have the harmonic absorbing member 51 or the insulating member 52 described in the first embodiment, but is attached directly to the chamber 2 by the insulating member 25. The other structure is the same as that described in the first embodiment.

The structure of the upper electrode 21 will be described below in detail.

Figure 7:
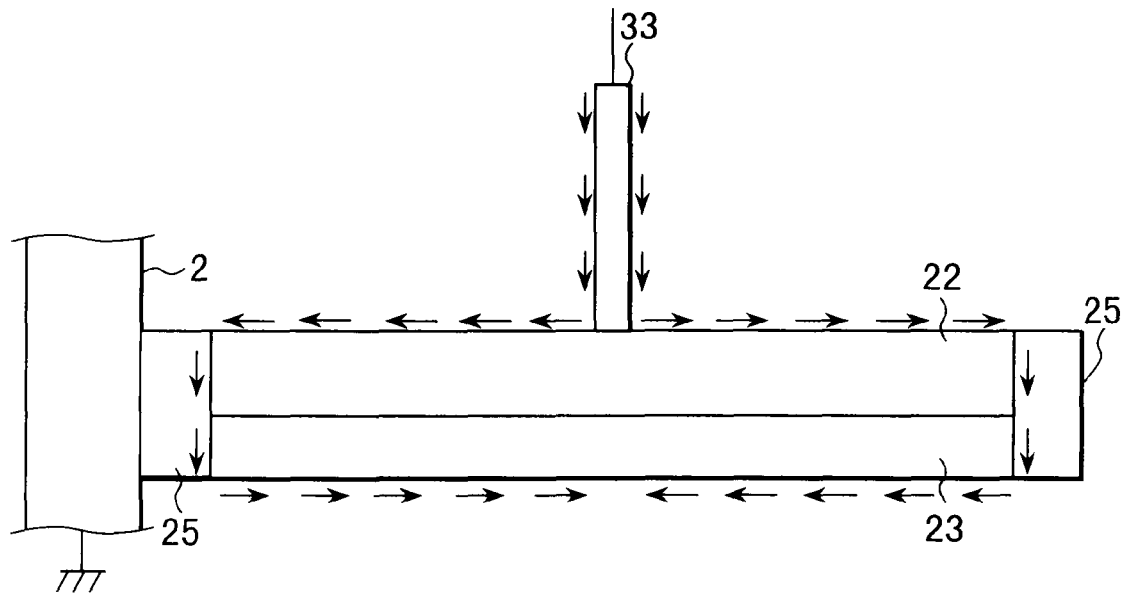
FIG. 7 is a sectional view schematically showing the supply path of the high frequency electric power on the electrode.

The electrode 23 of the upper electrode 21 is normally formed of a conductor or semiconductor such as Si, SiC or the like. When the frequency of the high frequency electric power 40 supplied via the electric power supplying rod 33 is increased, the skin effect will be generated to supply electric power only to the surface of the electrode. As shown in FIG. 7, the electric power passes the surface of the electric power supplying rod 33, the upper surface of the electrode supporting body 22, the side face of the electrode supporting body 22, and the side face of the electrode plate 23, and reaches the lower surface of the electrode plate 23, which is a plasma contacting face.

Figure 8:
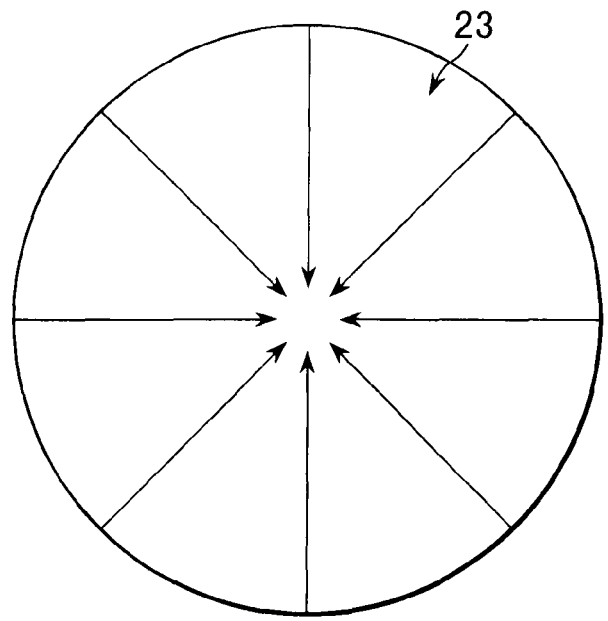
FIG. 8 is a bottom view schematically showing the supply path of the high frequency electric power on the electrode.

In this case, the electric power supplying rod 33 is connected to the center of the non-opposing face of the upper electrode 21, and thus the electric power has the same phase anywhere in the edge portion on the opposing face of the electrode plate 23. As shown in FIG. 8, the electric power having the same phase is supplied gradually toward the center of the opposing face from the edge portion of the electrode plate 23. With this constitution, the phase difference d/λ (λ is the wavelength of the electric wave on the electrode, and d is a radius of the electrode) is generated between the center and the edge portion of the electrode plate 23.

When the frequency of the high frequency electric power applied is increased, the inductance (LωjΩ) in the direction in which the electrode plate 23 is opposed to the suscepter 5 is not neglected. The impedance at the center of the opposing face of the electrode plate 23 will be decreased due to the interference by the phase difference d/λ, thereby the strength of the electric field of the center of the electrode plate 23 is higher than that of the edge portion. The center of the electrode plate 23 comes in contact with plasma, and thus is an open-circuit terminal of an RF equivalent circuit.

Accordingly, the electric field supplied to plasma is similar to the standing wave, which causes the unevenness of the density of plasma.

Figure 9:
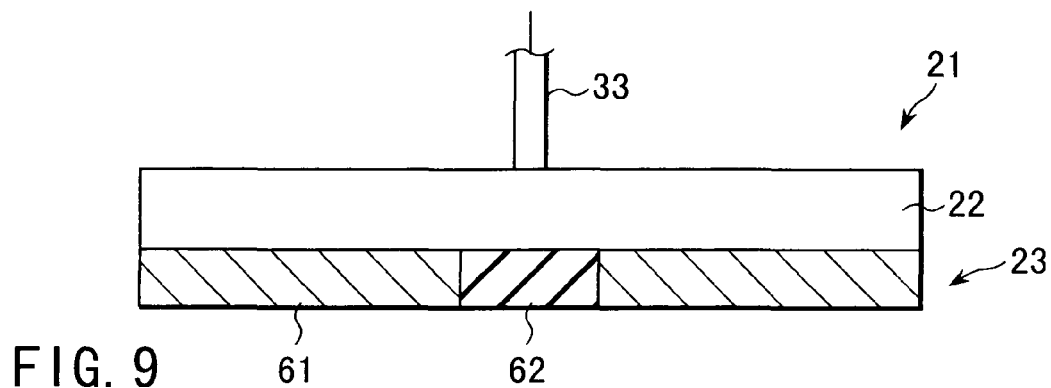
FIG. 9 is a sectional view schematically showing a first example of the upper electrode according to the second embodiment of the present invention.

In the first example to solve the unevenness of the density of plasma, the opposing face of the electrode plate 23 is constituted by an outer portion 61 formed of a conductor or semiconductor having a low resistivity of around 50 mΩ·cm and a central portion 62 formed of a dielectric, as shown in FIG. 9. By forming the central portion 62 of dielectric, the capacitance between the plasma and the dielectric is added at the portion. The impedance Z will be expressed as follows:

$$Z = L\omega - (1/C\omega)j$$

[where ω=2πf (f: frequency)]

The inductance component (Lω) in the direction of the diameter of the electrode plate 23 in the impedance Z can be thus offset by the capacitance component (−1/Cω) of the capacitance C of the dielectric member 62.

Accordingly, the change of the impedance Z due to the phase is prevented almost perfectly in the opposing face of the electrode plate 23, thereby the electric field strength of the center of the opposing face of the electrode plate 23 is decreased, which makes the electric field applied to plasma from the lower face of the electrode even, and the density of plasma can be also made even.

The diameter of the central portion 62 formed of dielectric is preferably 10 to 50 mmφ when the diameter of the electrode plate 21 is set at 300 mmφ. The dielectric constant of the dielectric comprising the central portion 62 needs to be set merely enough to offset the inductance component Lω, and thus the central portion 62 may be formed from a polyimide resin having a dielectric constant of 3, for example. The outer portion 61 can be formed from conductor or semiconductor such as Si, SiC or the like, which is normally used to form an electrode plate.

The second example of the upper electrode 21 will be described below.

Figure 10:
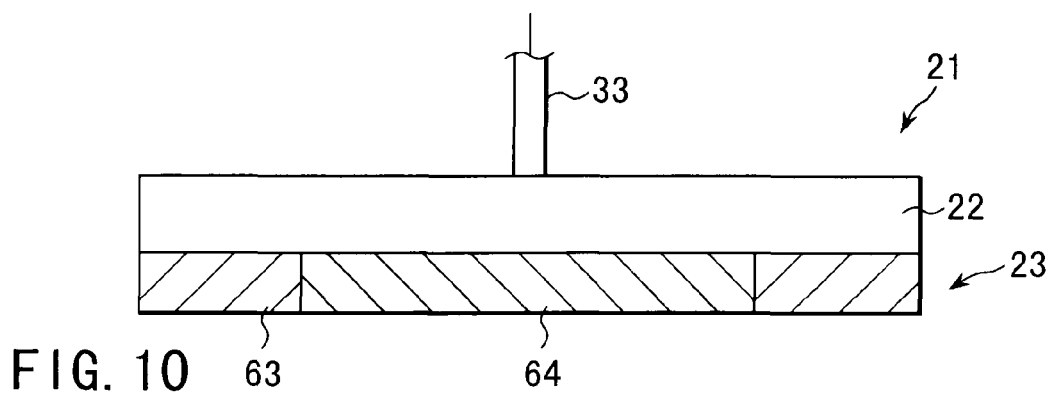
FIG. 10 is a sectional view schematically showing a second example of the upper electrode according to the second embodiment of the present invention.

According to the second example, the electrode plate 23 is constituted by an outer portion 63 formed of conductor or semiconductor having relatively low resistivity of 50 mΩ·cm for example, and a central portion 64 formed of high resistant member having relatively high resistivity of 1 to 100 Ω·cm, as shown in FIG. 10.

By forming the central portion 64 of such a high resistant member, the thickness of the portion supplied with electric power at the portion, i.e., so-called skin depth δ will be varied. More specifically, the skin depth δ can be expressed as $$\delta = (2/\omega\sigma\mu)^{1/2}$$

[where σ is conductivity, μ is magnetic permeability]
When the resistance becomes larger to decrease the conductivity σ, the skin depth δ will become larger.

Figure 11:
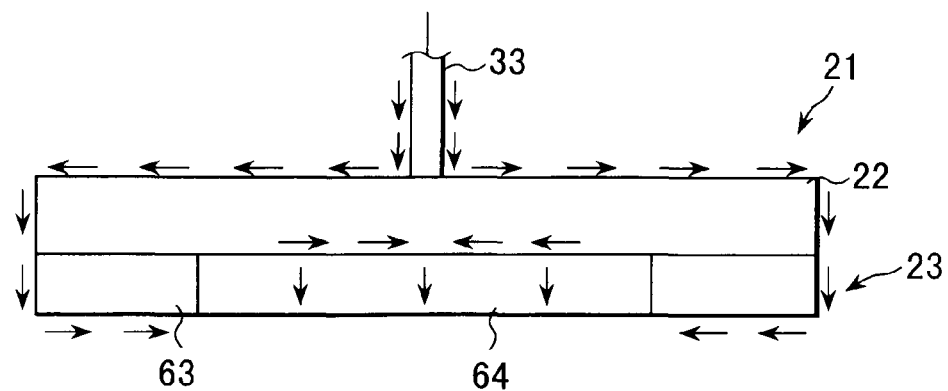
FIG. 11 is a sectional view schematically showing a supply path of the high frequency electric power in the second example of the upper electrode according to the second embodiment of the present invention.

When the skin depth δ of the high resistance member 64 increases more than the thickness of the high resistance member 64, the high frequency electric power reaches the rear face (non-opposing face) of the high resistance member 64 to be supplied there as shown in FIG. 11. On the way from the rear face to the lower face of the high resistance member 64, the high frequency electric power will be discharged as Joule heat.

By virtue of the heat discharge, the electric field strength of the center of the opposing face of the electrode plate 23 is made even, as the result, the electric field applied to plasma from the opposing face of the electrode plate 23 is made even, and the density of plasma can be also made even.

The diameter of the central portion of the high resistance member 64 is preferably 50 to 220 mmφ when the diameter of the electrode 21 is set at 300 mmφ. It is preferable that the high resistance member (central portion) 64 is formed from Si since the resistance can be adjusted merely by adjusting the amount of the dopant such as boron.

The outer portion 63 can be formed from a conductor or semiconductor such as Si, SiC or the like, which is normally used to form an electrode plate. It is easier to form the entire electrode plate 23 from Si and form the outer portion 63 and the high resistance member 64 by changing the doping amount of the dopant such as boron.

The third example of the upper electrode 21 will be described below.

Figure 12:
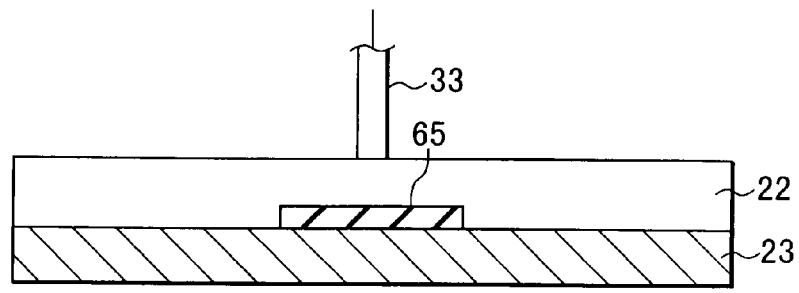
FIG. 12 is a sectional view schematically showing a third example of the upper electrode according to the second embodiment of the present invention.

According to the present example, a dielectric member 65 is provided to the electrode plate 23 to come in contact with the center of the non-opposing face of the electrode plate 23, as shown in FIG. 12. In this example, the electrode plate 23 is formed of conductor or semiconductor having resistivity within 1 to 100 Ω·cm, such that the skin depth δ is larger than the thickness of the electrode plate 23.

By forming the electrode plate 23 in such a manner, the high frequency electric power reaches the rear face (non-opposing face) of the electrode plate 23 to be supplied there. By arranging the dielectric member 65 on the central portion of the rear surface of the electrode plate 23, the capacitance between the plasma and the dielectric is added at the portion.

Accordingly, as in the first example, the inductance component (Lω) in the direction of the diameter in the impedance Z can be thus offset by the capacitance component (−1/Cω) of the capacitance C of the dielectric member 62. The change of the impedance Z due to the phase is thus decreased in the central portion of the opposing face of the electrode plate 23, thereby the electric field strength of the center of the opposing face of the electrode plate 23 is decreased, which makes the electric field applied to plasma from the lower face of the electrode even, and the density of plasma can be also made even.

In the third example, the electrode plate 23 need not be divided into two portions, unlike the first and second examples, and the conventional integrated electrode plate formed of a conductor and semiconductor can be employed.

The diameter of the dielectric member 65 formed of a dielectric is preferably 50 to 220 mmφ when the diameter of the electrode 21 is set at 300 mmφ. The dielectric constant of the dielectric member 65 needs to be set merely enough to offset the inductance component Lω, and thus the dielectric member 65 may be formed from a polyimide resin having a dielectric constant of 3, for example.

The fourth example of the upper electrode 21 will be described below.

Figure 13:
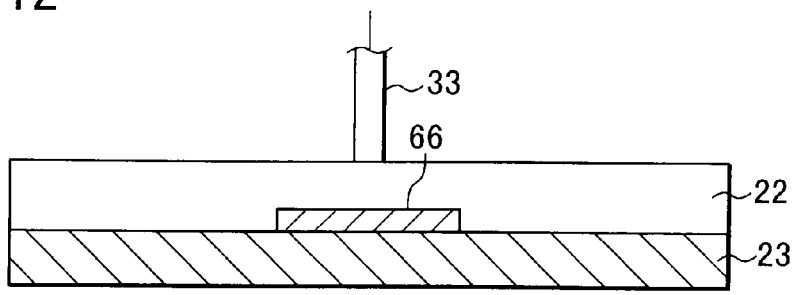
FIG. 13 is a sectional view schematically showing a fourth example of the upper electrode according to the second embodiment of the present invention.

According to the present example, a high resistant member 66 is provided to the electrode plate 23 to come in contact with the center of the rear face of the electrode plate 23, as shown in FIG. 13. According to the fourth example, the electrode plate 23 is formed of a high resistant member having resistivity within a range of 1 to 100 Ω·cm and the skin depth δ is larger than the thickness of the electrode plate 23.

By forming the electrode plate 23 in this manner, the high frequency electric power reaches the non-opposing face of the electrode plate 23 to be supplied there. By arranging the high resistant member 66 in the central portion of the rear face of the electrode plate 23, the high frequency electric power supplied thereto will be discharged as Joule heat. By virtue of the heat discharge, the electric field strength of the center of the opposing face of the electrode plate 23 is decreased. Accordingly, the electric field applied to plasma from the opposing face of the electrode is made even, and the density of plasma can be also made even. Also in the fourth example, the electrode plate 23 needs not to be divided into two portions, unlike the first and second examples, and the conventional integrated electrode plate formed of conductor and semiconductor can be employed.

The diameter of the high resistant member 66 formed of dielectric is preferably 50 to 220 mmφ when the diameter of the electrode 21 is set at 300 mmφ. It is preferable that the high resistant member 66 is formed from Si since the resistance can be adjusted merely by adjusting the amount of the dopant such as boron.

The fifth example of the upper electrode 21 will be described below.

Figure 14:
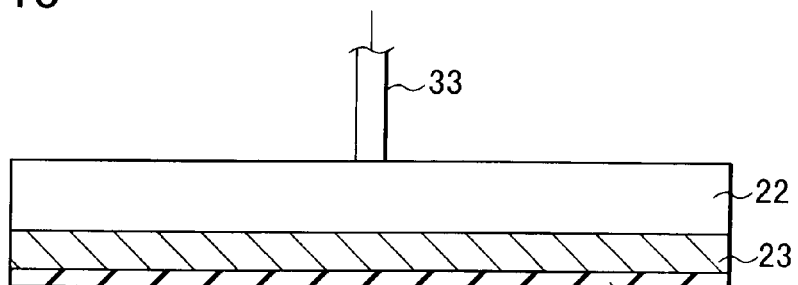
FIG. 14 is a sectional view schematically showing a fifth example of the upper electrode according to the second embodiment of the present invention.

According to the present example, an insulating layer 67 is provided on the opposing face of the electrode plate 23, as shown in FIG. 14. The insulating layer 67 can be formed by the frame spraying of ceramic or the like, but can also be formed in other ways. By forming the insulating layer 67 in this manner, the capacitive coupling is formed between plasma and the electrode plate 23 via the insulating layer 67.

In other words, there are a plenty of capacitors between the electrode plate 23 and plasma in an RF equivalent circuit. As a result, the inductance component (Lω) in the direction in which the suscepter 5 and the electrode plate 23 are opposed to each other can be thus offset by the capacitance component (−1/Cω) of the insulating layer 67.

The change of the impedance Z due to the phase is thus prevented almost perfectly on the opposing face of the electrode plate 23, thereby the electric field applied to plasma from the opposing face of the electrode is made even, and the density of plasma can be also made even.

The material and the thickness of the insulating layer 67 are determined such that the capacitance of the insulating layer is set high enough to offset the inductance component (Lω).

The unevenness of the electric field on the opposing face of the electrode plate 23 of the upper electrode 21 is caused not only by the change in direction of the inductance on the surface of the electrode when the frequency of the electric power applied to the electrode is increased. The unevenness of the electric field on the opposing face of the electrode plate 23 will be caused also in the case where the non-linear characteristics of plasma remarkably appears, a harmonic of the reflection wave from plasma is increased, and the harmonic generates a standing wave on the surface of the electrode.

More specifically, the reflection wave of the high frequency electric power from the plasma contains so much amount of harmonics. The harmonics are further reflected by the inductance component of the electric power supplying rod 33. Some of the harmonics contain the reflection waves reflected by the rod 33 having a wavelength for forming the standing wave when the diameter of the electrode 21 is set at 250 to 300 mmφ, the standing wave is formed on the opposing face of the electrode plate 23 to increase the electric field strength in the central portion of the surface of the electrode plate 23.

Figure 15:
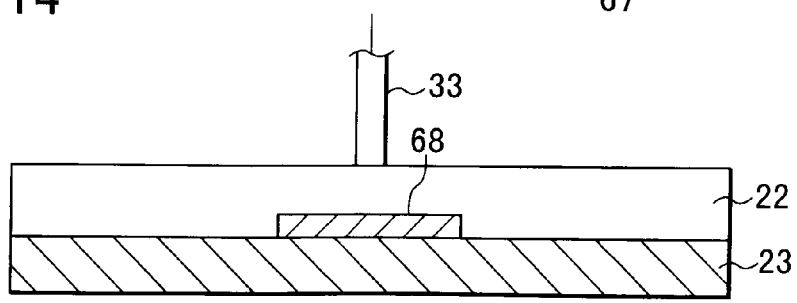
FIG. 15 is a sectional view schematically showing a sixth example of the upper electrode according to the second embodiment of the present invention.

In order to solve the above-mentioned problem, according to the sixth example of the upper electrode 21, a member 68 having an electromagnetic wave absorbing effect, such as ferrite sinter, is provided to the electrode plate 23 so as to come in contact with the central portion of the non-opposing face of the electrode plate 23, as shown in FIG. 15. With use of such a member 68, the harmonic from plasma is absorbed. By absorbing the harmonic in this manner, the standing wave can be prevented from being generated, the electric field on the opposing face of the electrode plate 23 is made even, and the density of plasma can be made even.

In this case, the member 68 having the electromagnetic wave absorbing effect is formed from the material having a property that absorbs the harmonic from plasma but does not absorb the frequency of the higher frequency electric power. The frequency band to be absorbed by the member 68 can be adjusted by the type of material and component.

The above-mentioned first to sixth examples of the upper electrodes in the second embodiment is effective particularly in the case where the frequency of the electric power applied to the electrode is 27 MHz or more, and the density of plasma is as high as $1 \times 10^{11}/cm^3$ or higher.

Next, the etching apparatus according to the second embodiment will be described about the example in which an oxide film formed on the wafer W is etched.

As in the first embodiment, the wafer W is transferred into the chamber 2 to be electrostatically attached to an electrostatic chuck 11. After the pressure of the chamber 2 is reduced to a predetermined level, the process gas is introduced into the chamber 2 to be blown to the wafer W under a predetermined pressure.

Subsequently, a high frequency electric power having frequency of 60 MHz is applied to the upper electrode 21 from the high frequency electric power source 40. By applying such a high frequency electric power, a high frequency electric field is generated between the upper electrode 21 and the suscepter (lower electrode) 5, and the process gas is dissociated therein to be plasma. On the other hand, the high frequency electric power source 50 applies electric power having high frequency within the range of 1 to 4 MHz, for example, 2 MHz, to the suscepter 5 as a lower electrode. By applying the high frequency wave in such a manner, the ions in the plasma are introduced into the side of the suscepter 5, and anisotropy of the etching is improved by the ion assistance.

By setting the frequency of the high frequency electric power applied to the upper electrode 21 at 27 MHz or higher, the density of plasma can be increased. However, in the conventional constitution of the upper electrode, the unevenness of the electric field on the opposing face of the electrode plate 23 will be caused due to the standing wave, as described before.

According to the present embodiment, any of the causes of the unevenness of the electric field on the opposing face of the electrode plate 23 can be eliminated by constituting the upper electrode 21 as described in the first to sixth examples. Accordingly, the electric field on the opposing face of the electrode plate 23 can be made even more than the conventional one, thereby the density of plasma can be made more even.

More specifically, with the above-mentioned constitution of the upper electrode, the frequency of the high frequency electric power is increased, and the problem unique to the case when the density of plasma is increased can be solved, thereby high-density and an even plasma can be generated.

Therefore, according to the present embodiment, the evenness of the etching can be improved to suitably cope with the downsizing of the design rule.

When the frequency of the electric power applied to the electrode is 27 MHz or more, and the density of plasma is as high as $1 \times 10^{11}/cm^3$ or higher, unevenness will easily occur. The above-mentioned upper electrode according to the present embodiment is effective particularly in such a case.

The present embodiment is not be limited to the above-mentioned examples, and various modifications can be made. For example, the upper and lower electrodes are applied with electric power having a high frequency, only the upper electrode may be applied with electric power having a high frequency. Further, the case where the upper electrode is applied with electric power having a high frequency of 27 to 50 MHz is described in the first embodiment, but the frequency is not limited to this range. In addition, the case where the semiconductor wafer is used as the substrate to be processed and etched is described in this embodiment, but the substrate is not limited to the semiconductor wafer, but another substrate, such as a liquid display apparatus (LCD) or the like, may be processed. The plasma processing is also not limited to etching, but another processing such as sputtering, CVD, or the like may be performed. The above-mentioned examples of the upper electrodes shown in the present embodiment can be employed together.

Figure 16:
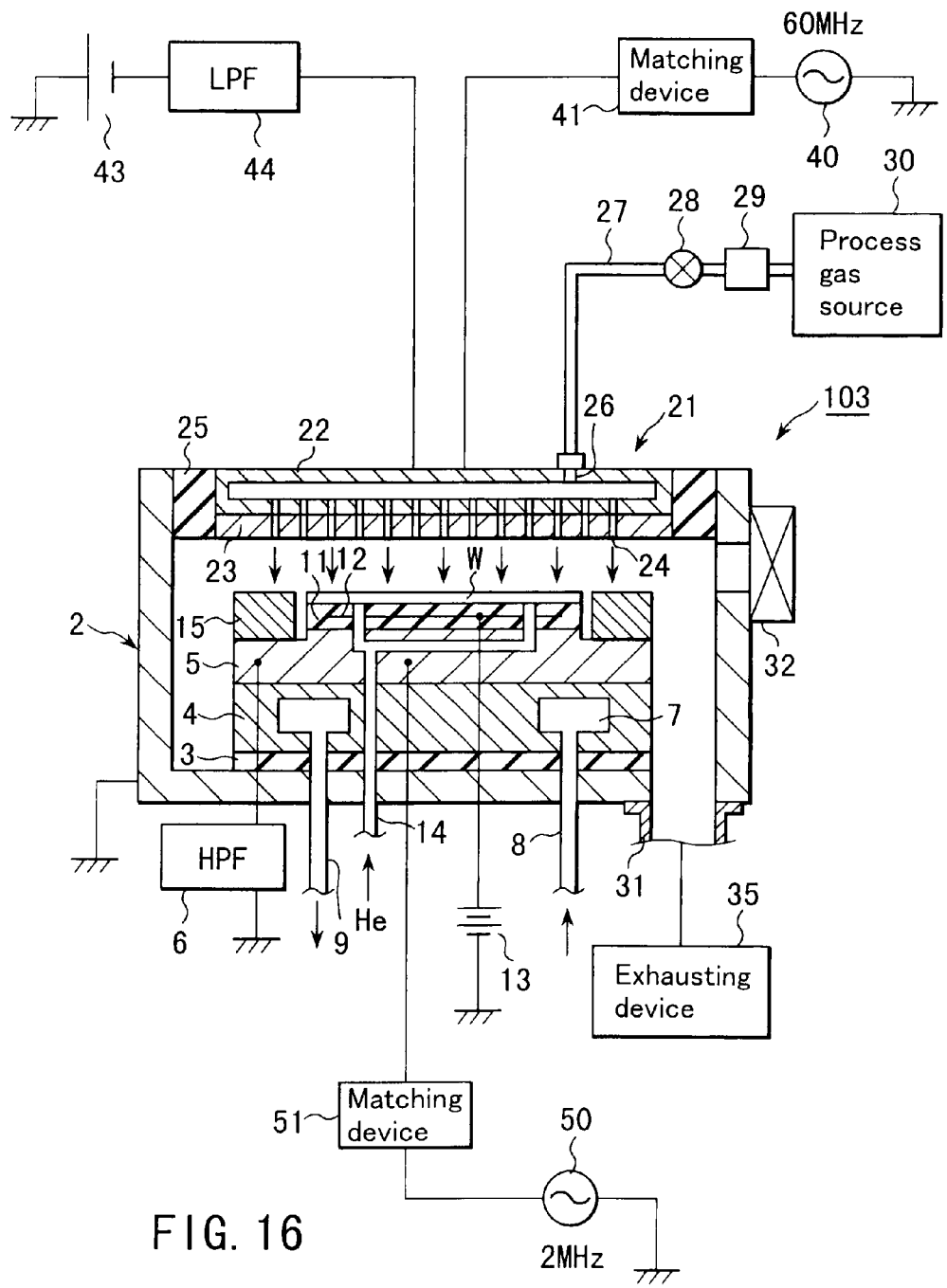
FIG. 16 is a sectional view showing the plasma etching apparatus according to the third embodiment of the present invention.

FIG. 16 shows an example of a constitution of a plasma processing apparatus according to the third embodiment of the present invention, used as a capacity coupling parallel plate etching apparatus. The same constituent elements as those of the first embodiment shown in FIG. 1 will be denoted by the same symbols and the description thereof will be omitted.

The etching apparatus 103 is different in that the electrode rod on the side of the upper electrode 21 is removed and the chamber 2 covering the rod is formed in a different shape. The upper electrode 21 is connected to a direct voltage source 43 for boosting a self bias voltage (Vdc) of the upper electrode 21 via a low pass filter (LPF) 44 for transmitting only a direct voltage.

The matching device 41 is provided therein with a capacitor (not shown) connected in series, and thus the high frequency electric power source 40 and the direct voltage source 43 will not conflict with each other.

The outer periphery of the upper electrode 21 is provided with an insulating member 25 formed in a ring-like shape along the periphery. The insulating member 25 is air-tightly attached at the outer peripheral face to the inner sidewall of the chamber 2. With this constitution, the harmonic absorbing member 51 is not provided to the apparatus of the present embodiment.

The operation of the plasma etching apparatus 103 constituted as above will be described below.

As in the first embodiment, the wafer W is transferred into the chamber 2 to be electrostatically attached to the electrostatic chuck 11. After the pressure of the chamber 2 is reduced to a predetermined level, the process gas is introduced into the chamber 2 to be blown to the wafer W under a predetermined pressure.

Subsequently, high frequency electric power having a frequency of 27 MHz or more, for example, 60 MHz, is applied to the upper electrode 21 from the high frequency electric power source 40. By applying such high frequency electric power, plasma is generated between the upper electrode 21 and the suscepter 5 to etch the wafer W. On the other hand, the high frequency electric power source 50 applies electric power having a high frequency of 2 MHz, for example, to the suscepter 5, and an etching with excellent anisotropy by ion assistance is performed.

Also in the present embodiment, the unevenness of the electric field will occur on the opposing face of the electrode plate 23, as in the first embodiment.

Figure 17A:
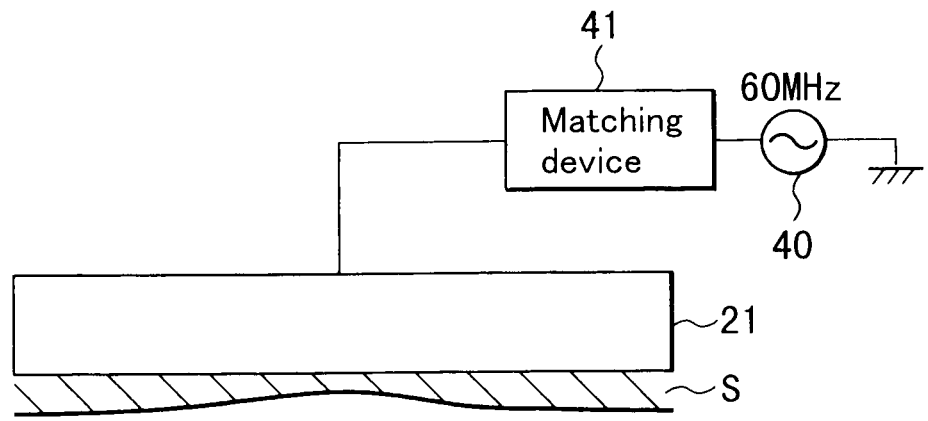
FIGS. 17A and 17B are schematic views for explaining the principle of the third embodiment of the present invention.

More specifically, when the high frequency electric power is applied only by the high frequency electric power source 40, the harmonic from the plasma generates a standing wave on the opposing face of the upper electrode 21, and an unevenness of the electric field will occur on the opposing face of the upper electrode 21. When the frequency of the high frequency electric power applied to the upper electrode is increased to 27 MHz or higher, the self bias voltage (Vdc) of the upper electrode 21 is decreased thereby. As a result, the thickness of the entire plasma sheath S of the upper electrode 21 will be decreased as shown in FIG. 17A. Due to the unevenness of the electric field by the standing wave, the plasma sheath of the central portion of the electrode will be further decreased in thickness. The change ratio of the thickness of the overall portion of the plasma sheath is increased in such a manner, and the self bias voltage (Vdc) on the surface of the upper electrode 21 will be made uneven. As a result, the evenness of plasma will be deteriorated.

Figure 17B:
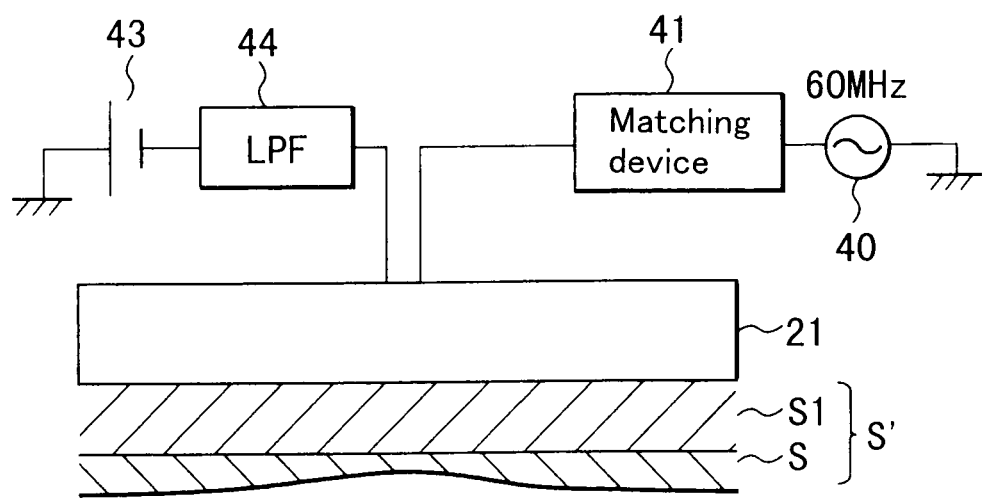

In contrast, by applying a high frequency electric power having a frequency higher than 27 MHz to the upper electrode 21 from the high frequency electric power source 40 and applying a direct voltage from the direct voltage source 43, the self bias voltage (Vdc) will be increased by the valve of the direct voltage as shown in FIG. 17B. The increased voltage S1 forms a thicker plasma sheath S', which can suppress the influence of the unevenness of the self bias voltage (Vdc) and the plasma sheath.

With this method, even if the unevenness occurs in the plasma density, the influence thereof will be suppressed at the minimum level, and the etching rate can be regarded to be even in the practical level.

For example, when high frequency electric power of 60 MHz and 1 kW is applied to the upper electrode 21 from the high frequency electric power source 40, the relationship Vdc=−100 V will be attained. Assuming the fluctuation of Vdc is around ±10 V, the fluctuation rate will be as large as ±10%, which will deteriorate the evenness of plasma.

However, when a direct voltage of −400 V, for example, is applied from the direct voltage source 43, the total sum of the self bias voltage (Vdc) will be increased to −(100+400)±10 V. As a result, the fluctuation rate will be decreased to ±2%, and the evenness of Vdc will be improved. The evenness of plasma can be considered to be also improved thereby.

The fourth embodiment of the present invention will be described below.

Figure 18:
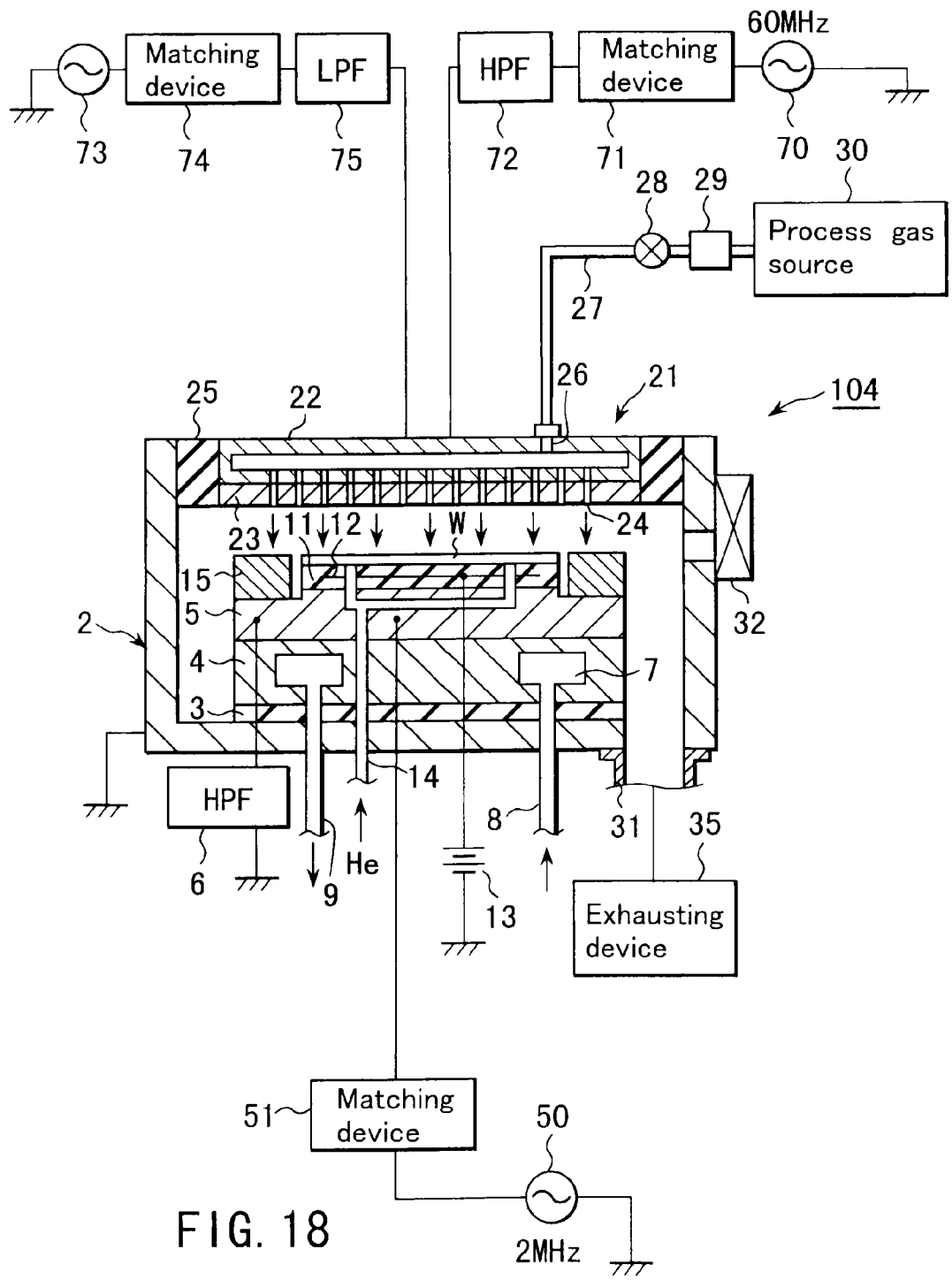
FIG. 18 is a sectional view showing the plasma etching apparatus according to the fourth embodiment of the present invention.

FIG. 18 shows an example of a constitution of a plasma processing apparatus according to the fourth embodiment of the present invention, used as a capacity coupling parallel plate etching apparatus. The same constituent elements as those of the second embodiment shown in FIG. 16 are denoted by the same symbols and the description thereof is omitted.

In the etching apparatus 104, the upper electrode 21 is connected to two high frequency electric power sources. One is the first high frequency electric power source 70 for generating plasma connected to the upper electrode 21 via a high pass filter (HPF) 72 and a matching device 71. The other is the second high frequency electric power source 73 connected to the upper electrode 21 via a low pass filter (LPF) 75 and a matching device 74.

The first high frequency electric power source 70 has a high frequency of 27 MHz or higher. By applying electric power having such a high frequency, suitably dissociated and high-density plasma can be generated in the chamber 2, thereby the plasma processing under a low pressure can be attained. In this example, the first high frequency electric power source 70 outputting high frequency electric power of 60 MHz is employed.

The second high frequency electric power source 73 outputs high frequency electric power of a frequency lower than that output from the first high frequency electric power source 70, preferably, 2 to 10 MHz. In the present embodiment, the second high frequency electric power source 73 outputting high frequency electric power of 2 MHz is employed.

More specifically, the second high frequency electric power source 73 outputs the high frequency electric power of a frequency lower than that output from the first high frequency electric power source 70, and thus functions to boost the self bias voltage (Vdc) of the upper electrode 21.

The high pass filter (HPF) 72 is intended to cut the current having a frequency equal or lower than the frequency of the second high frequency electric power source 73, and the low pass filter (LPF) 75 is provided to cut the current having a frequency equal to or higher than the frequency of the first high frequency electric power source 70.

The plasma etching apparatus 104 constituted as above performs the etching process in basically the same manner as using the plasma etching apparatus 103 according to the third embodiment.

At this time, the density of plasma can be increased by setting the frequency of the high frequency electric power applied to the upper electrode 21 at 27 MHz or higher. However, merely by increasing the frequency, the standing wave is generated on the opposing face of the electrode plate 23 by a harmonic due to the reflected wave from the plasma, which will cause unevenness of the electric field on the opposing face of the electrode plate 23.

Instead of the application of the direct voltage according to the third embodiment, according to the fourth embodiment, the second high frequency electric power source 73 applies the high frequency electric power having a frequency lower than the frequency of the first high frequency electric power source 70 to the upper electrode 21.

The self bias voltage generated by the high frequency electric power applied by the second high frequency electric power source 73 is larger than the self bias voltage generated by the high frequency electric power applied by the first high frequency electric power source 70. Therefore, the high frequency electric power from the first and second high frequency electric power sources 70 and 73 overlap, as a result, a remarkably high self bias voltage (Vdc) of the upper electrode 21 can be attained compared with the case where a high frequency electric power is applied to the electrode only from the first high frequency electric power source 60, as indicated in the embodiment described before. The increased voltage forms a thicker plasma sheath, which can suppress the influence of the unevenness of the self bias voltage (Vdc) and the plasma sheath, as in the case shown in FIG. 17(*b*).

With this method, the plasma density can be made even, on a practical basis, and the etching rate can be made even.

In an example where high frequency electric power of 60 MHz and 1 kW is applied to the upper electrode 21 from the high frequency electric power source 70, the relationship Vdc=−100 V will be attained. Assuming the fluctuation of Vdc is around ±10 V, the fluctuation rate will be as large as ±10%, which will deteriorate the evenness of plasma. However, when a high frequency electric power of 2 MHz and 500 W, for example, is applied to the upper electrode 21 from the second high frequency electric power source 73, the self bias voltage (Vdc) generated by the second high frequency electric power source 73 will be increased to around −400 V, and the total sum of the self bias voltage (Vdc) generated by the second high frequency electric power source 73 will be increased to −(100+400) V±10 V. As a result, the fluctuation rate will be decreased to ±2%, and the evenness of Vdc will be improved. The evenness of plasma can be also improved thereby.

The fourth embodiment is not be limited to the above-mentioned examples, and various modifications can be made.

For example, the upper and lower electrodes are applied with electric power having a high frequency, only the upper electrode 21 may be applied with electric power having a high frequency.

Further, where the oxide film formed on the wafer is etched using the semiconductor wafer, the present embodiment can be applied to an etching for an insulating film other than the oxide film, a polysilicon film, and the like. In addition, the substrate to be processed is not limited to the semiconductor wafer, and another substrate, such as a liquid display apparatus (LCD) or the like may be processed.

Figure 19:
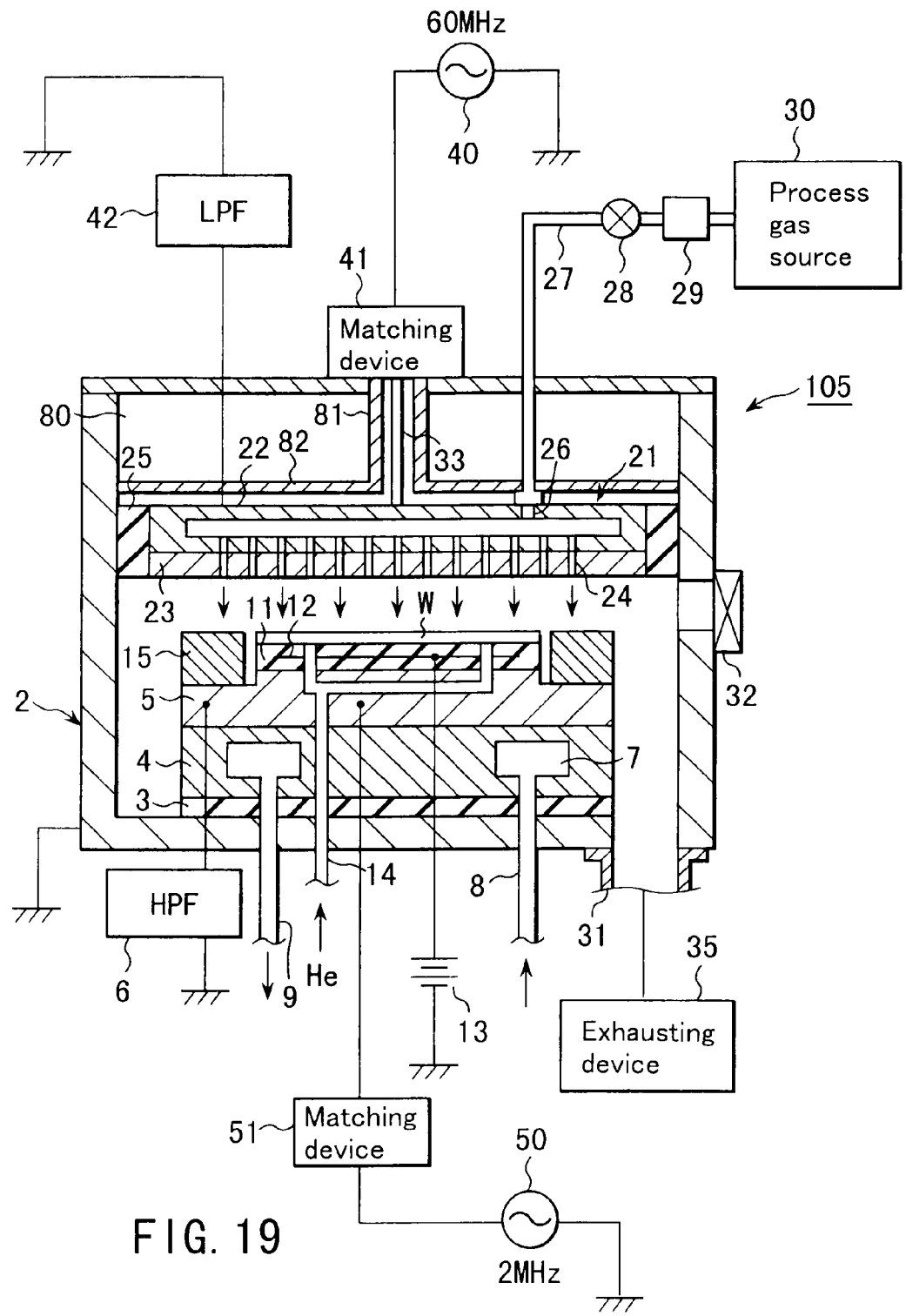
FIG. 19 is a sectional view showing the plasma etching apparatus according to the fifth embodiment of the present invention.

FIG. 19 shows an example of a constitution of a plasma processing apparatus according to the fifth embodiment of the present invention, used as a capacitive coupling type parallel plate etching apparatus. The same constituent elements as those of the first embodiment shown in FIG. 1 will be denoted by the same symbols and the description thereof will be omitted.

The etching apparatus 105 is constituted to have an electromagnetic wave shielding box 80 for shielding electromagnetic waves above the non-opposing face of the upper electrode 21 in the chamber 2.

In this constitution, the electric power supplying rod 33 for supplying high frequency electric power output from the high frequency electric power source 40 is connected to the electrode supporting body 22 of the upper electrode 21.

There is provided above the electrode supporting body 22 with a conductive plate-like member 82. A cylindrical member 81 and plate-like member 82 are electrically connected with each other, and the plate-like member 82 is connected to the grounded chamber 2.

More specifically, the cylindrical member 81 and the plate-like member 82 are grounded via the chamber 2. The cylindrical member 81 can decrease the inductance of the electric power supplying rod 33 as will be described later, and also ground the harmonics. The plate-like member 82 can also decrease the inductance of the upper electrode 21, and also ground the harmonics.

The other constituent elements are the same as those described in the first embodiment.

The operation of the plasma etching apparatus 105 constituted as above will be described below. In this embodiment, the etching of the film formed on the wafer W will be described.

As in the first embodiment, the wafer W is transferred into the chamber 2 to be electrostatically attached to electrostatic chuck 11. After the pressure of the chamber 2 is reduced to a predetermined level, the process gas is introduced into the chamber 2 to be blown to the wafer W under a predetermined pressure.

Subsequently, high frequency electric power having a frequency of 27 MHz or more, for example, 60 MHz, is applied to the upper electrode 21 from the high frequency electric power source 40. By applying such a high frequency electric power, plasma is generated between the upper electrode 21 and the suscepter 5 to etch the wafer W. On the other hand, the high frequency electric power source 50 applies electric power having a high frequency of 2 MHz, for example, to the suscepter 5, and an etching with excellent anisotropy by ion assistance is performed.

In general, the density of plasma can be increased by increasing the high frequency electric power applied to the upper electrode 21 to 27 MHz or higher, as described before. However, the inductance of the electric power applying rod is very large, and thus the harmonic is reflected from the plasma by the inductance component of the electric power applying rod. The reflected harmonic is further reflected by the faces of the electromagnetic wave shielding box 80, and returns to the opposing face of the upper electrode 21 generating the plasma. Particularly with an electrode having a diameter of 250-300 mmφ, a standing wave will be easily generated on the surface of the electrode due to the harmonic, which makes the electric field on the electrode uneven.

Figure 20:
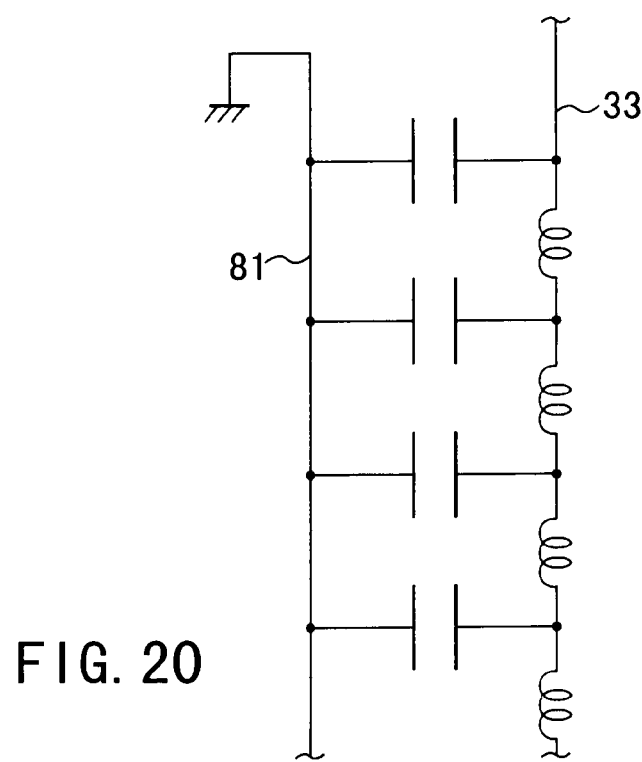
FIG. 20 is a circuit diagram showing an equivalent circuit of an electric power supplying rod and a cylindrical conductive member in the plasma etching apparatus according to the fifth embodiment of the present invention.

In contrast, according to the present embodiment, the conductive cylindrical member 81 is arranged near the electric power supplying rod 33. This constitution is equivalent to a circuit having a number of capacitors arranged in parallel between the cylindrical member 81 and the electric power supplying rod 33, as shown in FIG. 20. The inductance component of the electric power supplying rod 33 is cancelled by the capacitance component of the capacitors to decrease the impedance, with the result that the inductance component of the electric power supplying rod 33 will be decreased.

The cylindrical member 81 is grounded via the chamber 2, and thus the harmonic reflected by the electric power supplying rod 33 will be grounded through the cylindrical member 61.

Accordingly, the harmonic from plasma will not be easily reflected by the electric power supplying rod 33, and the harmonic itself will be decreased, with the result that a standing wave generated by the reflection of the harmonic will not be easily generated on the plasma contacting face (opposing face) of the electrode plate 23.

Consequently, the electric field on the plasma contacting face of the electrode plate 23 can be made more even, which makes the plasma density even.

Figure 21:
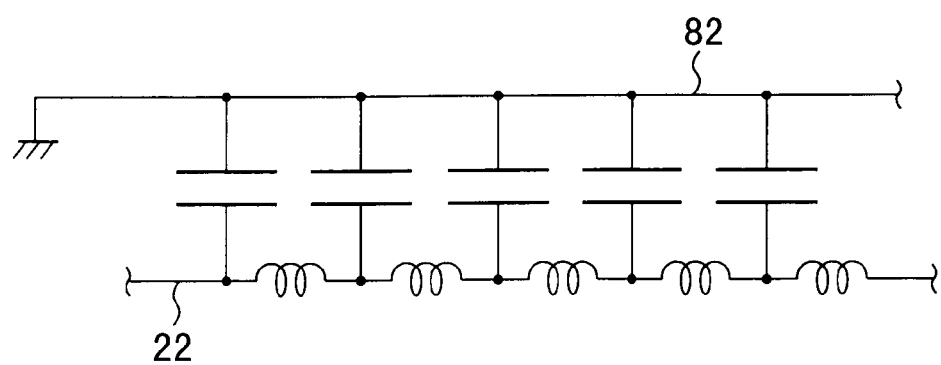
FIG. 21 is a circuit diagram showing an equivalent circuit of an upper surface of the upper electrode (electrode supporting body) and a plate-like conductive member in the plasma etching apparatus according to the fifth embodiment of the present invention.

The inductance component on the non-opposing face of the electrode supporting body 22 will contribute to generate a standing wave due to the reflection of the harmonic. However, according to the present embodiment, the plate-like member 82 is arranged near the non-opposing face of the electrode supporting body 22, which is equal to the equivalent circuit having a number of capacitors arranged in parallel between the electrode supporting body 22 and the plate-like member 62, as shown in FIG. 21. The inductance component at the portion will be decreased, according to the same principle as mentioned above. The harmonic will be grounded through the plate-like member 82.

Accordingly, the plate-like member 82 will further improve the standing wave preventing effect.

The distance between the cylindrical member 81 and the electric power supplying rod 33, and the distance between the plate-like member 62 and the electrode supporting body 22 need to be set suitably in accordance with the capacitance necessary for canceling the standing wave. For example, when the high frequency electric power is set at 2 kW, the distances need to be set at 8 mm or more to prevent the breakdown in air.

In point of view of forming the capacitors, no component needs to be provided between the cylindrical member 81 and the electric power supplying rod 33, and the distance between the plate-like member 62 and the electrode supporting body 22. However, if the filtering function needs to be improved, an electric wave absorbing body may be provided therebetween. Similarly, if the dielectric constant needs to be adjusted, a dielectric such as a fluoroplastic (trade name: Teflon) may be provided.

Figure 22:
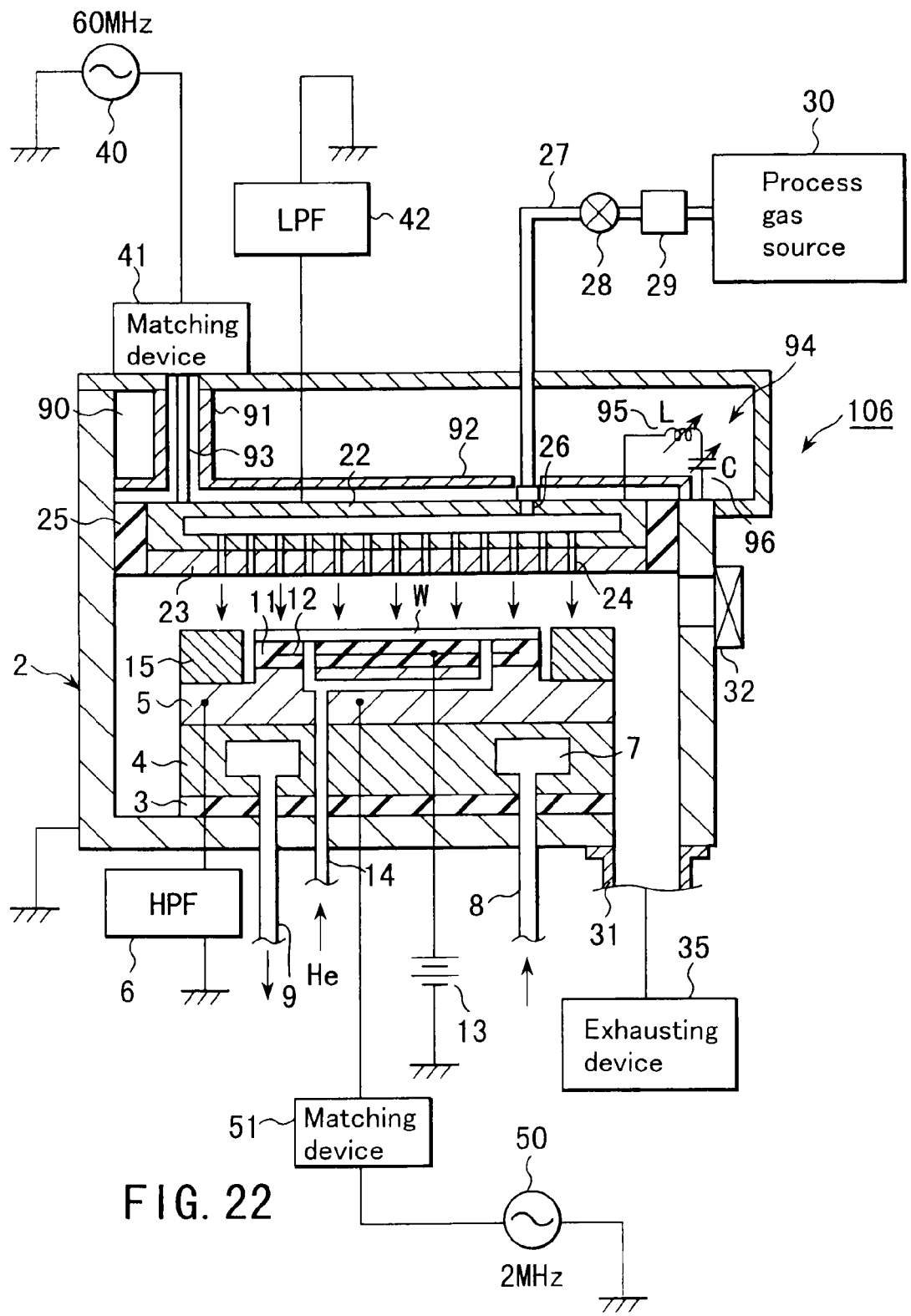
FIG. 22 is a sectional view showing the plasma etching apparatus according to the sixth embodiment of the present invention.

FIG. 22 shows an example of a constitution of a plasma processing apparatus according to the sixth embodiment of the present invention, used as a capacitive coupling type parallel plate etching apparatus. The same constituent elements as those of the first embodiment shown in FIG. 1 are denoted by the same symbols and the description thereof is omitted.

In the etching apparatus 106, an electric power supplying rod 93 is arranged at a position shifted from the central portion of the non-opposing face of the upper electrode 21 so as to supply electric power. According to the fifth embodiment, the electric supplying rod 93 is arranged at the central portion of the non-opposing face of the upper electrode 21.

There is further provided to the non-opposing face of the upper electrode 21 with an LC circuit 94 in the opposite side of the position of the electric supplying rod 93. The LC circuit 94 functions to adjust the phase of the voltage and current of the high frequency electric power supplied to the upper electrode 21.

The LC circuit 94 is constructed by a coil 95 capable of varying an inductance and a capacitor 96 capable of varying a capacitance, and connected in series between the upper electrode 21 and the chamber 2.

There is provided a conductive cylindrical member 91 near the electric power supplying rod 93 and a conductive plate-like member 92 near the upper portion of the electrode supporting body 22. The cylindrical member 91 and the plate-like member 92 are electrically connected with each other, and the plate-like member 92 is electrically connected to the grounded chamber 2.

The other constituent elements are the same as those described in the first embodiment.

The plasma etching apparatus 106 constituted as above performs a similar etching process to that performed by the plasma etching apparatus 105.

However, when the high frequency electric power applied to the upper electrode 21 is increased to 27 MHz or higher, a standing wave will be generated for the same reason as described before, and unevenness of the electric field on the electrode will occur thereby.

When the electric power supplying rod 33 is arranged in the center of the upper electrode 21, the phase difference $d/\lambda$ ($\lambda$ is the wavelength of the electric wave on the electrode, and d is a radius of the electrode) is generated between the center and the edge portion of the electrode plate 23, as shown in FIGS. 7 and 8 before.

In the equivalent electric circuit, the electric power applied to the outer portion of the upper electrode 21 is grounded via an insulator in parallel with the direction in which electric power is supplied to the plasma, and terminated at characteristic impedance (50Ω), and thus the electric field strength Eo at the outer portion is expressed as $$Eo = E \cdot \cos(\omega t)$$

The electric field strength Eo at the central portion of the upper electrode 21 is expressed as $$Ec = E \cdot \cos(\omega t + d/\lambda)$$

where $\lambda$ is the (wavelength shortening) wavelength of the high frequency electric power applied to the electrode and harmonic generated by the reflection from plasma, and the high frequency electric power via plasma.

In this time, the high frequency electric power is gradually supplied to the central portion from the outer portion, and thus the voltage and the current will be concentrated at the central portion from the outer portion in the electrode plate 23. When the frequency of the high frequency electric power is increased, the inductance in the direction in which the electrode plate 23 is opposed to will become too large to be neglected. The impedance at the center of the opposing face of the electrode plate 23 will be decreased due to the interference by the phase difference.

Due to the above-mentioned problems, the strength of the electric field of the center of the electrode plate 23 is higher than that of the edge portion. The center of the electrode plate 23 comes in contact with plasma, and thus is an open-circuit edge of an RF equivalent circuit. Accordingly, a standing wave having a wavelength $\lambda = 2d$ is generated on the opposing face of the electrode plate 23, which causes unevenness of the density of plasma.

In order to prevent a standing wave generated due to the above-mentioned problems, according to the present embodiment, high frequency electric power is supplied to the position shifted from the central portion to the outer portion of the upper electrode 21 via an electric power supplying rod 93, and an LC circuit 94 as phase adjusting means is provided opposite the electric power supplying rod 93 on the non-opposing face of the upper electrode 21 with respect to the center. By constituting the apparatus in this manner, the phases of the voltage and the current of the high frequency electric power supplied to the upper electrode 21 are made uneven on the outer periphery.

More specifically, by supplying high frequency electric power to the position shifted from the central portion to the outer portion of the upper electrode 21, the concentration of the voltage and current paths on the opposing face of the electrode plate 23 is prevented. Thereafter, the phases of the voltage and the current of the high frequency electric power supplied to the upper electrode 21 can be made uneven on the circumference of the electrode plate 23 by adjusting the inductance of the coil 95 and the capacitance of the capacitor 96 by using the LC circuit 94 so as to shift the phases of the voltage and the current. By making the phases uneven, a standing wave which will be caused by the electric power supplied from the center of the electrode to the opposing face of the electrode plate 23 can be prevented.

Accordingly, the electric field on the opposing face, i.e., the plasma contacting face of the electrode plate 23, can be made more even, thereby the evenness of the plasma density can be attained.

The apparatus of the present embodiment is provided with the cylindrical member 91 and the plate-like member 92, similarly to the first embodiment, and thus the standing wave due to the reflection of a harmonic cannot be easily generated on the plasma contacting face (opposing face) of the electrode plate 23, and thus the electric field on the plasma contacting face of the electrode plate 23, can be made more even.

The above-mentioned advantage can be attained at a predetermined level if the electric power supplying rod 93 is shifted more or less from the center of the upper electrode 21. However, when the electrode has a diameter of 250 mm, it is preferable to shift 60 mm or more the electric power supplying rod 93 from the center of the upper electrode 21.

In any of the fifth and sixth embodiments, the higher the frequency of the electric power applied to the electrode, the easier the standing wave is generated. The inventions are thus useful particularly in the case where the frequency of the electric power is 27 MHz or higher. If the frequency of the electric power used is lower than 27 MHz, however, it cannot be said that there is no influence of the standing wave, and thus the present invention will attain a level of advantage.

Similarly, when the density of plasma is as high as $1 \times 10^{11}/cm^3$ or higher, the unevenness will easily occur. The above-mentioned upper electrode according to the present embodiment is effective particularly in such a case.

The fifth and sixth embodiments can be employed to attain even better evenness of the density of plasma.

The present embodiment will not be limited to the above-mentioned examples, and various modifications can be made.

For example, the upper and lower electrodes are applied with electric power having a high frequency, only one of the electrodes may be applied with electric power having a high frequency.

Further, the case where the upper electrode is applied with electric power is described in the present embodiment, but can be applied to the lower electrode. In addition, the case where the semiconductor wafer is used as the substrate to be processed and etched is described in this embodiment, but the substrate is not limited to the semiconductor wafer, and other substrates, such as a liquid display apparatus (LCD) or the like, may be processed. The plasma processing is also not limited to etching, and other processings such as sputtering, CVD, or the like may be performed.

INDUSTRIAL APPLICABILITY

The plasma processing apparatus according to the present invention us provided with a harmonic absorbing member for absorbing harmonic having frequency of the high frequency wave electric power applied by the high frequency wave electric power applying means is arranged to come in contact with the electrode. The harmonic absorbing member absorbs the harmonic before returning to the high frequency electric power source. A standing wave due to the harmonic is prevented from being generated, and the density of plasma is even.

Further, the plasma processing apparatus according to the present invention has two high frequency electric power sources. When high frequency electric power having a frequency higher than 27 MHz is applied to the electrode for generating plasma from one of the high frequency electric power sources, the high frequency electric power having a lower frequency than that of the above electric power is applied from the other one of the power sources, thereby the self bias voltages (Vdc) generated by the power sources overlap, to attain a high level self bias voltage. By the increased self bias voltages (Vdc) the plasma sheath is made thicker, which can suppress the unevenness of the plasma sheath due to the unevenness of the self bias voltage (Vdc). As a result, evenness can be attained of the plasma density, and the etching rate can be made even when the apparatus is used for etching.

The invention claimed is:

1. A plasma processing apparatus comprising:
a chamber configured to be maintained at a reduced pressure;
an upper electrode and a lower electrode arranged to be opposed to each other in the chamber, wherein:
   a substrate to be processed is held on an opposing face of the lower electrode, and
   the upper electrode has an electrode supporting member, and an electrode plate arranged to be opposed to the lower electrode,
   the electrode plate to be exposed to plasma being disposed on a lower surface of the electrode supporting member, and having a ring-shaped outer portion constituted by a conductor or semiconductor and a central portion formed of a high resistance member with higher resistivity than that of the outer portion;
a process gas source connected to the chamber, and
a high frequency electric power source configured to provide high frequency electric power within a range of 27 MHz to 60 MHz from a face of the upper electrode to which the lower electrode is opposed in order to form a high frequency electric field between the upper and the lower electrodes to generate a plasma of the process gas, wherein a predetermined plasma processing is performed on the substrate to be processed with the plasma,
and wherein
the central portion of the electrode plate, which is formed of the high resistance member, has a skin depth $\delta$ expressed by the following formula that is larger than the central portion of the electrode plate in thickness:

$$\delta = (2/\omega\sigma\mu)^{1/2},$$

where $\omega = 2\pi f$ (f is frequency), $\sigma$ is conductivity, and $\mu$ is magnetic permeability.

2. The plasma processing apparatus according to claim 1, wherein:
both the outer portion and the central portion of the electrode plate are formed from silicon (Si), and
the outer portion having low resistivity and the central portion having high resistivity are formed by differentiating doping amounts of dopant into the outer portion and the central portion.

3. The plasma processing apparatus according to claim 1, wherein a frequency of the high frequency electric power applied to the upper electrode by the high frequency electric power source is 27 MHz or higher, and a density of formed plasma is $1 \times 10^{11}/cm^3$ or higher.

4. The plasma processing apparatus according to claim 1, wherein the central portion has a resistivity of 1 to 100 $\Omega \cdot cm$.

* * * * *